(12) United States Patent
Holland et al.

(10) Patent No.: US 11,923,884 B2
(45) Date of Patent: Mar. 5, 2024

(54) CONFIGURABLE HARMONIC REJECTION MIXER (HRM)

(71) Applicant: QUALCOMM Incorporated, San Diego, CA (US)

(72) Inventors: Kyle David Holland, San Diego, CA (US); Jang Joon Lee, San Diego, CA (US); Prakash Thoppay Egambaram, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 17/448,847

(22) Filed: Sep. 24, 2021

(65) Prior Publication Data
US 2023/0101419 A1 Mar. 30, 2023

(51) Int. Cl.
*H04B 1/30* (2006.01)
*H03D 7/14* (2006.01)
(Continued)

(52) U.S. Cl.
CPC ............ *H04B 1/30* (2013.01); *H03D 7/1458* (2013.01); *H03D 7/165* (2013.01);
(Continued)

(58) Field of Classification Search
CPC ........... H03D 7/165; H03D 2200/0086; H03D 7/1458; H04B 1/0042; H04B 1/10; H04B 1/0483; H04B 1/30; H04B 2001/307
(Continued)

(56) References Cited

U.S. PATENT DOCUMENTS

| 7,130,604 | B1 * | 10/2006 | Wong | ....................... H03D 7/12 455/302 |
| 7,187,917 | B2 * | 3/2007 | Lin | ........................ H03B 27/00 327/119 |

(Continued)

FOREIGN PATENT DOCUMENTS

| CN | 1871766 A | 11/2006 |
| EP | 0576078 B1 | 5/1999 |

(Continued)

OTHER PUBLICATIONS

Partial International Search Report—PCT/US2022/074847—ISA/EPO—dated Dec. 1, 2022.

(Continued)

*Primary Examiner* — Tan H Trinh
(74) *Attorney, Agent, or Firm* — QUALCOMM Incorporated

(57) ABSTRACT

This disclosure provides systems, methods, and devices for wireless communication that support reconfiguring degeneration components in a converged RF transceiver supporting carrier aggregation across sub-6 GHz frequency bands and mmWave frequency bands. In a first aspect, an apparatus includes an input port configured to receive a mixer input signal; a first mixer forming at least a portion of an HRM mixer and coupled to the input port; a first configurable degeneration component of a first processing path coupled between the input port and the first mixer; and a controller coupled to the first degeneration component, wherein the controller is configured to control a first aspect of a first degeneration component. Other aspects and features are also claimed and described.

33 Claims, 10 Drawing Sheets

(51) Int. Cl.
*H03D 7/16* (2006.01)
*H04B 1/04* (2006.01)

(52) U.S. Cl.
CPC ... *H04B 1/0483* (2013.01); *H03D 2200/0086* (2013.01); *H04B 2001/307* (2013.01)

(58) Field of Classification Search
USPC .......................................................... 455/340
See application file for complete search history.

(56) References Cited

U.S. PATENT DOCUMENTS

| | | | | |
|---|---|---|---|---|
| 8,285,240 | B2* | 10/2012 | Seendripu | H03D 7/166 455/317 |
| 8,306,157 | B2* | 11/2012 | Seendripu | H04B 1/30 375/330 |
| 8,478,215 | B2 | 7/2013 | Matsui | |
| 8,909,187 | B2* | 12/2014 | Seendripu | H03D 3/007 455/317 |
| 8,929,840 | B2* | 1/2015 | Aniruddhan | H03D 7/1483 455/318 |
| 2006/0246861 | A1* | 11/2006 | Dosanjh | H03D 3/007 455/147 |
| 2007/0049215 | A1* | 3/2007 | Chen | H03D 7/1441 455/86 |
| 2009/0239495 | A1* | 9/2009 | Sellars | H03D 7/1441 455/333 |
| 2011/0115539 | A1* | 5/2011 | Brekelmans | H03K 23/54 327/285 |
| 2011/0294454 | A1* | 12/2011 | Robert | H03H 7/0153 455/323 |
| 2012/0049926 | A1* | 3/2012 | Shimizu | H03D 7/165 327/355 |
| 2012/0322398 | A1* | 12/2012 | Pullela | H03D 7/1466 455/302 |
| 2013/0009688 | A1* | 1/2013 | Din | H03D 7/165 327/356 |
| 2013/0130632 | A1* | 5/2013 | Oishi | H04B 1/403 455/84 |
| 2013/0155748 | A1* | 6/2013 | Sundstrom | H04B 1/0032 363/157 |
| 2013/0265892 | A1* | 10/2013 | Fernando | H04B 1/1027 370/252 |
| 2013/0278321 | A1* | 10/2013 | Sundstrom | H03D 7/1466 327/358 |
| 2014/0266415 | A1 | 9/2014 | Kerr et al. | |
| 2015/0137854 | A1* | 5/2015 | Li | H03M 1/167 327/93 |
| 2015/0180521 | A1* | 6/2015 | Tripurari | H03D 7/1441 375/349 |
| 2015/0280651 | A1 | 10/2015 | Uzunkol et al. | |
| 2016/0112146 | A1 | 4/2016 | Lau et al. | |
| 2018/0139078 | A1 | 5/2018 | Mittal et al. | |
| 2019/0238117 | A1* | 8/2019 | Yu | H03D 7/1441 |
| 2020/0112289 | A1 | 4/2020 | Rogers | |
| 2022/0085762 | A1* | 3/2022 | Delos | H03D 7/165 |
| 2022/0337292 | A1* | 10/2022 | Jain | H04B 7/01 |

FOREIGN PATENT DOCUMENTS

| | | |
|---|---|---|
| EP | 1289137 A1 | 3/2003 |
| WO | WO-2020116708 A1 | 6/2020 |
| WO | WO-2020125933 A1 | 6/2020 |

OTHER PUBLICATIONS

Zhu J., "Architectures and Circuit Techniques for High-Performance Field-Programmable CMOS Software Defined Radios", Academics Commons, Columbia University, 2017, 181 pages.
International Search Report and Written Opinion—PCT/US2022/074847—ISA/EPO—dated Jan. 24, 2023.

* cited by examiner

CONFIGURABLE HARMONIC REJECTION MIXER (HRM)

TECHNICAL FIELD

Aspects of the present disclosure relate generally to wireless communication systems, and more particularly, to radio frequency (RF) processing circuitry for wireless communication systems. Some features may enable and provide improved communications, including improved operation of RF transceivers, such as in carrier aggregation (CA) operation.

INTRODUCTION

Wireless communication networks are widely deployed to provide various communication services such as voice, video, packet data, messaging, broadcast, and the like. These wireless networks may be multiple-access networks capable of supporting multiple users by sharing the available network resources. Such networks may be multiple access networks that support communications for multiple users by sharing the available network resources.

A wireless communication network may include several components. These components may include wireless communication devices, such as base stations (or node Bs) that may support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on a downlink to a UE or may receive data and control information on an uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

Modern wireless communication networks are sophisticated networks that involve operation on multiple frequencies and multiple frequency ranges. RF signals in different frequencies and ranges may use different components or different configurations of components to support a device operating on these wireless communication networks and maintain high signal integrity and high bandwidth across a range of possible network conditions. The duplication of components and number of supported configurations presents challenges in designing RF systems for the UEs and BSs operating on wireless communication networks.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

A solution for supporting multiple networks in a UE may include co-locating or sharing of components, such as downconverter circuits, across different wireless networks using different wireless network technologies. For example, signals at different frequencies may be processed through the same RF transceiver. A single converged radio frequency (RF) transceiver built as an integrated circuit (IC) on one substrate may process RF signals for receive or transmit at multiple frequencies, such as process RF signals corresponding to sub-6 GHz signals, mmWave IF signals, and/or mmWave RF signals. The downconverter circuits may include harmonic rejection mixers (HRMs) with tunable elements in a receive path for overall down-conversion with a tuning configuration that reduces interference between signals at different frequencies. Harmonic rejection mixers (HRMs) may be mixer circuits that convert input signals by summing square waves sampled from sine wave input signals, with the square waves weighted to reduce third and fifth harmonics of the input signal. In some examples, the tunable elements may be configured to suppress upconversion of third and/or fifth harmonics. Suppressing a harmonic may refer to reducing in magnitude or eliminating the presence of a harmonic in a non-baseband (BB) signal. The tunable elements may include configurable RF degeneration components that adjust degeneration to further reduce interference resulting from higher-order harmonics of one band on another band at or near those higher-order harmonic frequencies.

A RF transceiver for a wireless device, either a UE or a BS, whether built as a single IC or not, may support carrier aggregation (CA). In RF transceivers with inter-band carrier aggregation, numerous frequency band combinations exist in which the transmission of one band can interfere with (e.g., de-sense) another frequency band processed within the RF transceiver through nearby or shared transmissions lines. In examples of this disclosure, harmonic rejection mixers (HRMs) may be implemented in the receiver circuit to protect one frequency band (e.g., a victim band) from interference from another frequency band (e.g., an aggressor band). The RF transceiver may be configured, such as by adjusting values of the degeneration components, based on characteristics of the RF signals processed by the wireless device. For example, the receiver circuit may be configured to reject aggressors at $3*F_{LO}$ and/or $5*F_{LO}$. As another example, the receiver circuit may be configured to reduce interference caused by interactions between the transmission signals and the local oscillator (LO) harmonics of the mixer can result in modulated spurs at $4*F_{LO}-F_{Tx}$ or $4*F_{LO}+F_{Tx}$ due to upconversion at $3*F_{LO}$ or $5*F_{LO}$, respectively.

The harmonic rejection mixers (HRMs) may be configured during operation of the RF transceiver based on the frequency bands in use by the RF transceiver. Modes, with corresponding configuration parameters, can be defined for the HRMs. For example, the HRMs may have an upconversion HRM configuration and a downconversion HRM conversion. The HRM can be configured into the upconversion mode or downconversion mode to improve rejection of the third and/or fifth harmonic on either the upconversion path or the downconversion path. The configuration of the RF transceiver can be adjusted based on detecting certain conditions or signal frequencies in an RF signal received at an antenna and/or based on receiving information about radio configuration from higher levels (e.g., information received in downlink grants that specify carrier aggregation operation on particular frequency bands). In some examples, the downconversion configuration may be activated to improve rejection of third and fifth harmonic signals and the upconversion configuration may be activated to improve rejection of the $4*F_{LO}-F_{Tx}$ and $4*F_{LO}+F_{Tx}$ signals.

Examples of the receiver circuits described herein may include three main mixer modes of operation that can be configured based on specific combinations of CA configurations, band configurations, and/or baseband filter (BBF) configurations. In one example use case, a CA configuration with n5 and n7 bands (or n21 and N257 bands) causes the controller to reconfigure the receiver circuit as an upconverter HRM to assist in transmission at baseband being upconverted to $4*F_{LO}-F_{Tx}$. In another example use case, a CA configuration with n71 and n2 bands causes the controller to reconfigure the receiver circuit to improve rejection of the n2 transmission frequency by directly downconverting at $3*F_{LO}$ of the n71 band. In a further use case, for low gain modes with weak transmission levels, or for band combinations without a relevant mechanism, the receiver circuit may be configured in a non-HRM mode in which downconversion is performed though mixers that are coupled to the same input port.

In one aspect of the disclosure, a method for wireless communication includes receiving a mixer input signal; determining a plurality of frequencies active in the mixer input signal; configuring a first degeneration component associated with a first mixer comprising a harmonic rejection mixer (HRM) based on the plurality of frequencies; and/or down-converting the mixer input signal in the first mixer.

In an additional aspect of the disclosure, a method for wireless communication includes determining a carrier aggregation (CA) configuration of a mixer input signal; controlling a first degeneration component of a first mixer based on the CA configuration; controlling a second degeneration component of a second mixer based on the CA configuration; and/or downconverting the mixer input signal through the first mixer and the second mixer.

In an additional aspect of the disclosure, an apparatus includes at least one processor and a memory coupled to the at least one processor. The at least one processor is configured to perform or cause to perform portions or all of the methods described herein.

In an additional aspect of the disclosure, an apparatus includes an input port configured to receive a mixer input signal; a first mixer forming at least a portion of a harmonic rejection mixer (HRM); a first configurable degeneration component of a first processing path coupled between the input port and the first mixer; and/or a controller coupled to the first configurable degeneration component, wherein the controller is configured to control a first aspect of the first configurable degeneration component.

In an additional aspect of the disclosure, an apparatus includes means for determining a carrier aggregation (CA) configuration of a mixer input signal; means for controlling a first degeneration component of a first mixer based on the CA configuration and for controlling a second degeneration component of a second mixer based on the CA configuration; first means for downconverting the mixer input signal; and/or second means for downconverting the mixer input signal.

In an additional aspect of the disclosure, an apparatus includes a first mixer coupled between an output of a low noise amplifier (LNA) and a node at an input to a baseband circuit; a second mixer coupled between the output of the LNA and the node at the input of the baseband circuit; and/or a first degeneration component coupled between the output of the LNA and the second mixer, the second mixer configured to suppress upconversion of one or more harmonics based at least on a value of the first degeneration component.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Like reference numbers and designations in the various drawings indicate like elements.

DETAILED DESCRIPTION

Figure 1:
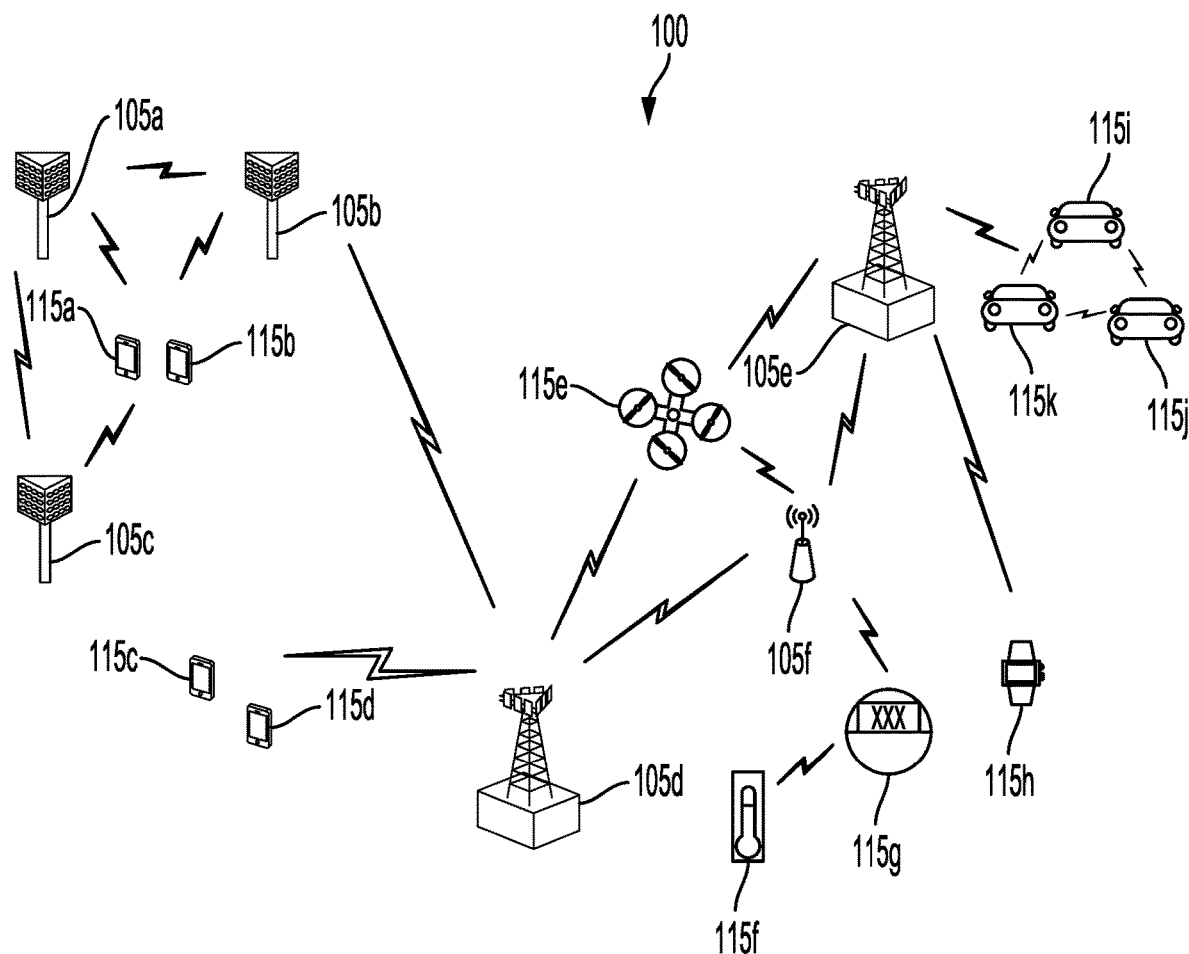
FIG. 1 is a block diagram illustrating details of an example wireless communication system according to one or more aspects.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

This disclosure relates generally to providing or participating in authorized shared access between two or more wireless devices in one or more wireless communications systems, also referred to as wireless communications networks. In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, 5$^{th}$ Generation (5G) or new radio (NR) networks (sometimes referred to as "5G NR" networks, systems, or devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with UTRANs in the case of a UMTS/GSM network. Additionally, an operator network may also include one or more LTE networks, or one or more other networks. The various different network types may use different radio access technologies (RATs) and RANs.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long-term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3GPP is a collaboration between groups of telecommunications associations that aims to define a globally applicable third generation (3G) mobile phone specification. 3GPP LTE is a 3GPP project which was aimed at improving UMTS mobile phone standard. The 3GPP may define specifications for the next generation of mobile networks, mobile systems, and mobile devices. The present disclosure may describe certain aspects with reference to LTE, 4G, or 5G NR technologies; however, the description is not intended to be limited to a specific technology or application, and one or more aspects described with reference to one technology may be understood to be applicable to another technology. Additionally, one or more aspects of the present disclosure may be related to shared access to wireless spectrum between networks using different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1 M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 millisecond (ms)), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

Devices, networks, and systems may be configured to communicate via one or more portions of the electromagnetic spectrum. The electromagnetic spectrum is often subdivided, based on frequency or wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" (mmWave) band in documents and articles, despite being different from the extremely high frequency (EHF) band (30 GHz-300 GHz) which is identified by the International Telecommunications Union (ITU) as a "mmWave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "mmWave" or the like if used herein may broadly represent frequencies that may include mid-band frequencies, may be within FR2, or may be within the EHF band.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD) design or frequency division duplex (FDD) design; and advanced wireless technologies, such as massive multiple input, multiple output (MIMO), robust mmWave transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD or TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink or downlink scheduling information, data, and acknowledgement in the same subframe. The self-contained integrated subframe supports communications in unlicensed or contention-based shared spectrum, adaptive uplink or downlink that may be flexibly configured on a per-cell basis to dynamically switch between uplink and downlink to meet the current traffic needs.

For clarity, certain aspects of the apparatus and techniques may be described below with reference to example 5G NR implementations or in a 5G-centric way, and 5G terminology may be used as illustrative examples in portions of the description below; however, the description is not intended to be limited to 5G applications.

Moreover, it should be understood that, in operation, wireless communication networks adapted according to the concepts herein may operate with any combination of licensed or unlicensed spectrum depending on loading and availability. Accordingly, it will be apparent to a person having ordinary skill in the art that the systems, apparatus and methods described herein may be applied to other communications systems and applications than the particular examples provided.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail devices or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

FIG. 1 is a block diagram illustrating details of an example wireless communication system according to one or more aspects. The wireless communication system may include wireless network 100. Wireless network 100 may, for example, include a 5G wireless network. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" may refer to this particular geographic coverage area of a base station or a base station subsystem serving the coverage area, depending on the context in which the term is used. In implementations of wireless network 100 herein, base stations 105 may be associated with a same operator or different operators (e.g., wireless network 100 may include a plurality of operator wireless networks). Additionally, in implementations of wireless network 100 herein, base station 105 may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In some other examples, each base station 105 and UE 115 may be operated by a single network operating entity.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the implementation illustrated in FIG. 1 are examples of mobile smart phone-type devices accessing wireless network 100. A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 100 may occur using wired or wireless communication links.

In operation at wireless network 100, base stations 105a-105c serve UEs 115a and 115b using 3D beamforming and coordinated spatial techniques, such as coordinated multi-point (CoMP) or multi-connectivity. Macro base station 105d performs backhaul communications with base stations 105a-105c, as well as small cell, base station 105f. Macro base station 105d also transmits multicast services which are subscribed to and received by UEs 115c and 115d. Such multicast services may include mobile television or stream video, or may include other services for providing community information, such as weather emergencies or alerts, such as Amber alerts or gray alerts.

Wireless network 100 of implementations supports mission critical communications with ultra-reliable and redundant links for mission critical devices, such UE 115e, which is a drone. Redundant communication links with UE 115e include from macro base stations 105d and 105e, as well as small cell base station 105f. Other machine type devices, such as UE 115f (thermometer), UE 115g (smart meter), and UE 115h (wearable device) may communicate through wireless network 100 either directly with base stations, such as small cell base station 105f, and macro base station 105e, or in multi-hop configurations by communicating with another user device which relays its information to the network, such as UE 115f communicating temperature measurement information to the smart meter, UE 115g, which is then reported to the network through small cell base station 105f. Wireless network 100 may also provide additional network efficiency through dynamic, low-latency TDD communications or low-latency FDD communications, such as in a vehicle-to-vehicle (V2V) mesh network between UEs 115i-115k communicating with macro base station 105e.

Figure 2:
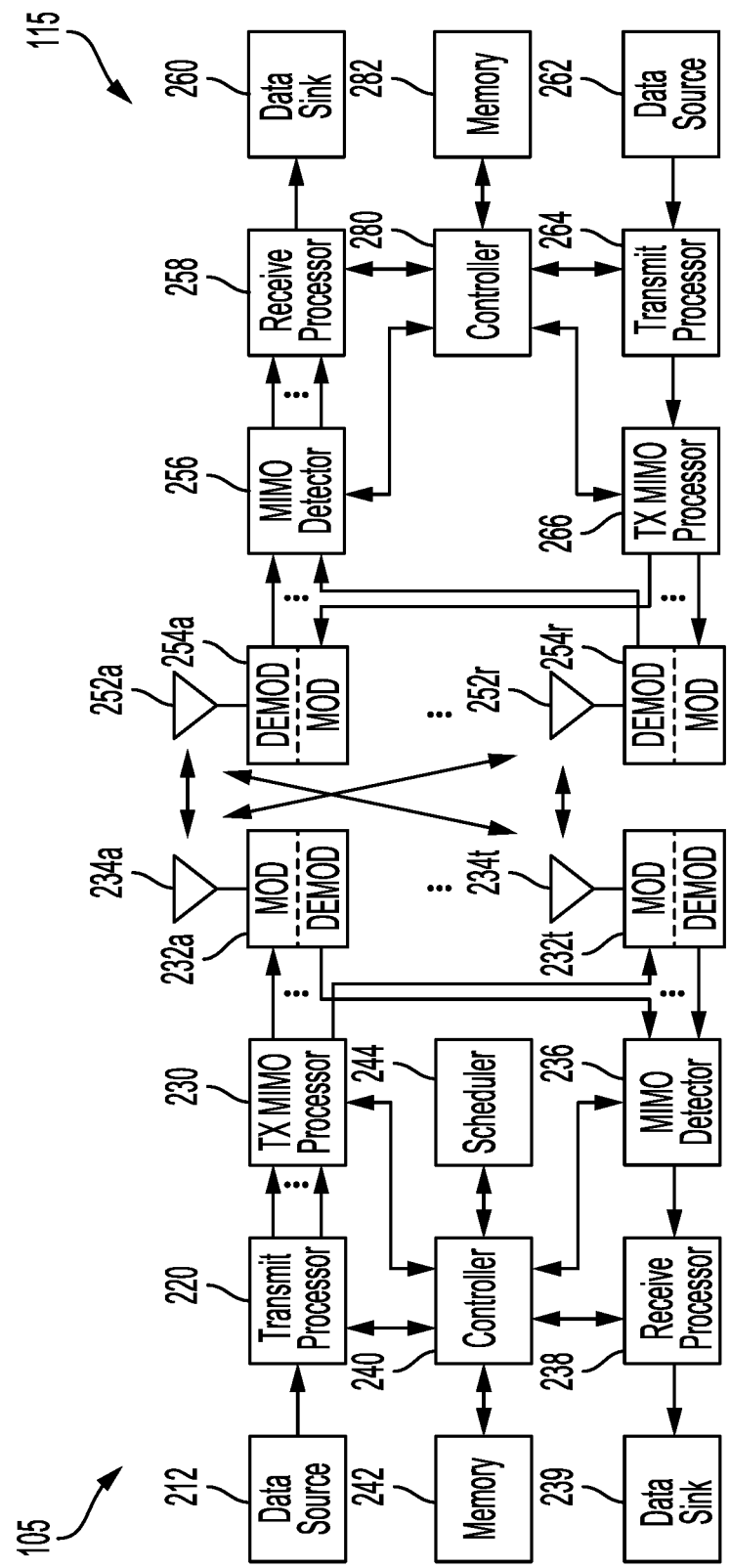
FIG. 2 is a block diagram illustrating examples of a base station and a user equipment (UE) according to one or more aspects.

FIG. 2 is a block diagram illustrating examples of base station 105 and UE 115 according to one or more aspects. Base station 105 and UE 115 may be any of the base stations and one of the UEs in FIG. 1. For a restricted association scenario (as mentioned above), base station 105 may be small cell base station 105f in FIG. 1, and UE 115 may be UE 115c or 115d operating in a service area of base station 105f, which in order to access small cell base station 105f, would be included in a list of accessible UEs for small cell base station 105f. Base station 105 may also be a base station of some other type. As shown in FIG. 2, base station 105 may be equipped with antennas 234a through 234t, and UE 115 may be equipped with antennas 252a through 252r for facilitating wireless communications.

At base station 105, transmit processor 220 may receive data from data source 212 and control information from controller 240, such as a processor. The control information may be for a physical broadcast channel (PBCH), a physical control format indicator channel (PCFICH), a physical hybrid-ARQ (automatic repeat request) indicator channel (PHICH), a physical downlink control channel (PDCCH), an enhanced physical downlink control channel (EPDCCH), an MTC physical downlink control channel (MPDCCH), etc. The data may be for a physical downlink shared channel (PDSCH), etc. Additionally, transmit processor 220 may process (e.g., encode and symbol map) the data and control information to obtain data symbols and control symbols, respectively. Transmit processor 220 may also generate reference symbols, e.g., for the primary synchronization signal (PSS) and secondary synchronization signal (SSS), and cell-specific reference signal. Transmit (TX) MIMO processor 230 may perform spatial processing (e.g., precoding) on the data symbols, the control symbols, or the reference symbols, if applicable, and may provide output symbol streams to modulators (MODs) 232a through 232t. For example, spatial processing performed on the data symbols, the control symbols, or the reference symbols may include precoding. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232a through 232t may be transmitted via antennas 234a through 234t, respectively.

At UE 115, antennas 252a through 252r may receive the downlink signals from base station 105 and may provide received signals to demodulators (DEMODs) 254a through 254r, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254a through 254r, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller 280, such as a processor.

On the uplink, at UE 115, transmit processor 264 may receive and process data (e.g., for a physical uplink shared channel (PUSCH)) from data source 262 and control information (e.g., for a physical uplink control channel (PUCCH)) from controller 280. Additionally, transmit processor 264 may also generate reference symbols for a reference signal. The symbols from transmit processor 264 may be precoded by TX MIMO processor 266 if applicable, further processed by modulators 254a through 254r (e.g., for SC-FDM, etc.), and transmitted to base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Receive processor 238 may provide the decoded data to data sink 239 and the decoded control information to controller 240.

Controllers 240 and 280 may direct the operation at base station 105 and UE 115, respectively. Controller 240 or other processors and modules at base station 105 or controller 280 or other processors and modules at UE 115 may perform or direct the execution of various processes for the techniques described herein, such as to perform or direct the execution illustrated in FIG. 5 or FIG. 6, or other processes for the techniques described herein. Memories 242 and 282 may store data and program codes for base station 105 and UE 115, respectively. Scheduler 244 may schedule UEs for data transmission on the downlink or the uplink.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen-before-talk or listen-before-transmitting (LBT) procedure such as a clear channel assessment (CCA) prior to communicating in order to determine whether the shared channel is available. In some implementations, a CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own backoff window based on the amount of energy detected on a channel or the acknowledge/negative-acknowledge (ACK/NACK) feedback for its own transmitted packets as a proxy for collisions.

Figure 3A:
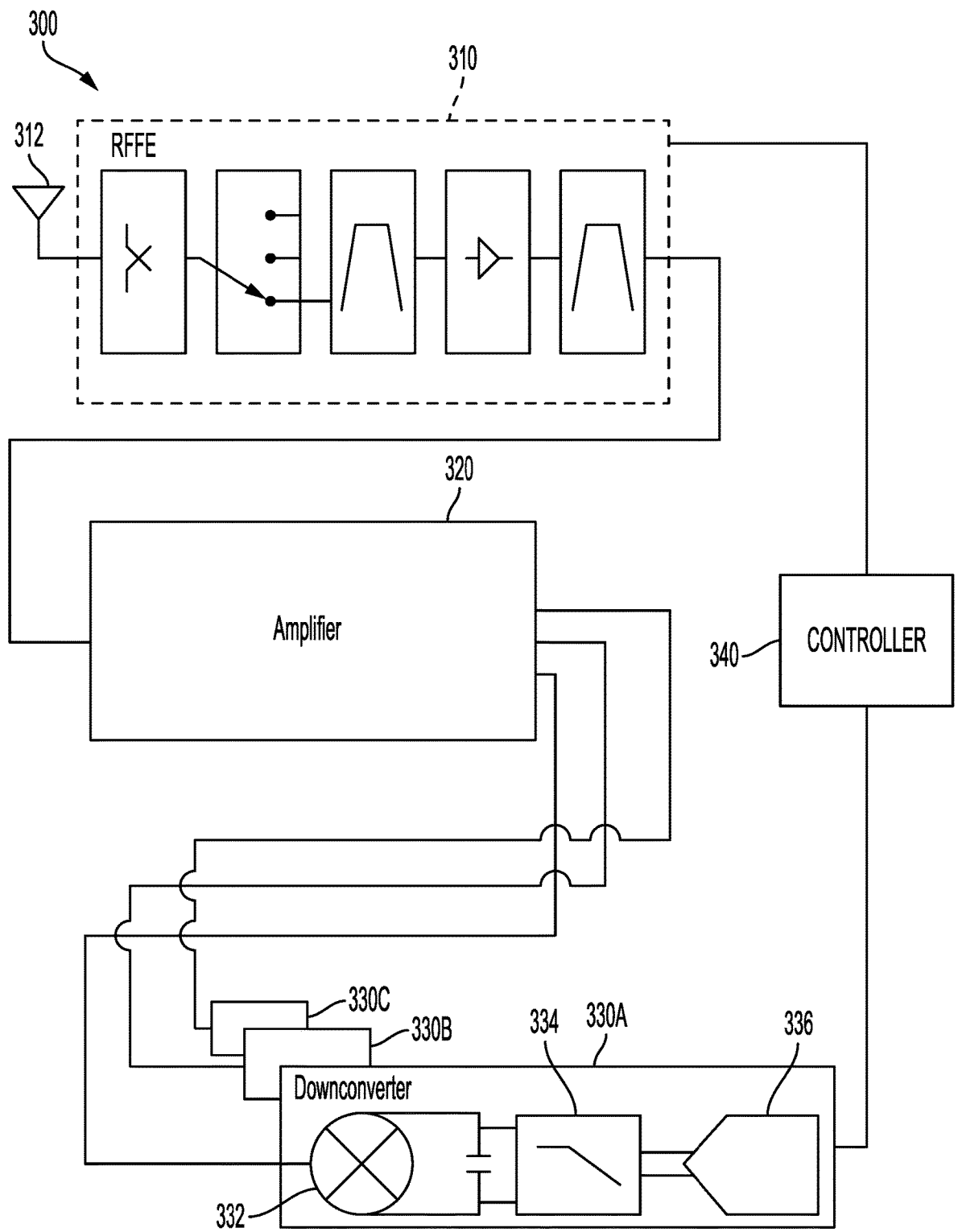
FIG. 3A is a block diagram illustrating a converged sub-6 Ghz and mmWave radio frequency (RF) transceiver according to one or more aspects.

FIG. 3A is a block diagram illustrating a wireless receiver circuit 300 according to one or more aspects. In some embodiments, the receiver circuit 300 may be part of a converged sub-6 Ghz and mmWave radio frequency (RF) transceiver, and in some embodiments part of a single integrated circuit (IC) sharing a common substrate. The receiver circuit 300 may include an antenna 312 to receive radio frequency (RF) signals. The antenna 312 is coupled to a RF front-end (RFFE) 310, which may include duplexers, SAW filters, switches, and/or LNAs. The RFFE 310 is coupled to an amplifier 320, such as a low noise amplifier (LNA). The amplifier 320 is coupled to one or more downconverters 330A, 330B, and 330C. Each of the downconverters 330A, 330B, and 330C may include mixers 332, baseband filters (BBFs) 334, and/or analog-to-digital converters (ADCs) 336. The downconverters 330A, 330B, 330C may include one or more harmonic rejection mixers (HRMs). In some embodiments, the amplifier 320 is shared on an IC with one or more of the RFFE 310 and/or the downconverters 330A, 330B, and 330C.

Interference between wireless signals received at antenna 312 and processed through RFFE 310, amplifier 320, and downconverters 330A-C complicates operation of the receiver circuit 300, particularly when processing a large range of potential frequencies. For example, co-location of processing paths for sub-6 Ghz and mmWave signals in an integrated circuit can create interference between the sub-6 GHz signal harmonics and the mmWave signals. Interference between sub-6 GHz signals and mmWave signals may occur because mmWave IF signals corresponding to mmWave RF signals received at an antenna from over-the-air may be located near to sub-6 GHz signals in frequency (e.g., within 1-6 GHz) and/or located at harmonics of the sub-6 GHz (e.g., at integer multiples of the sub-6 GHz signals). Interference between wireless signals may be further complicated by carrier aggregation (CA) operation. Carrier aggregation (CA) involves the combination of one or more carrier RF signals to carry a single data stream. Carrier aggregation (CA) improves the flexibility of the wireless devices and improves network utilization by allowing devices to be assigned different numbers of carriers for different periods of time based, at least in part, on historical, instantaneous, and/or predicted bandwidth use by the wireless device. Thus, when a mobile device needs additional bandwidth, additional carriers may be assigned to that wireless device, and then de-assigned and re-assigned to other mobile devices when bandwidth demands change. As carriers are assigned and de-assigned from a mobile device, the interaction of wireless signals may change. For example, different carriers in CA may be in different bands, and certain bands may have harmonics that overlap and/or otherwise interfere with certain other bands. A controller 340 may detect conditions in the RF signal received from the antenna 312 or receive information regarding the carrier configuration from higher levels, such as a MAC layer or network layer. The controller 340 may configure components of the receiver circuit 300 to reduce interference between bands within the receiver circuit 300. In some embodiments, the controller 340 may configure one or more degeneration components in one or more processing paths of mixers within the downconverters 330A, 330B, and 330C.

Figure 3B:
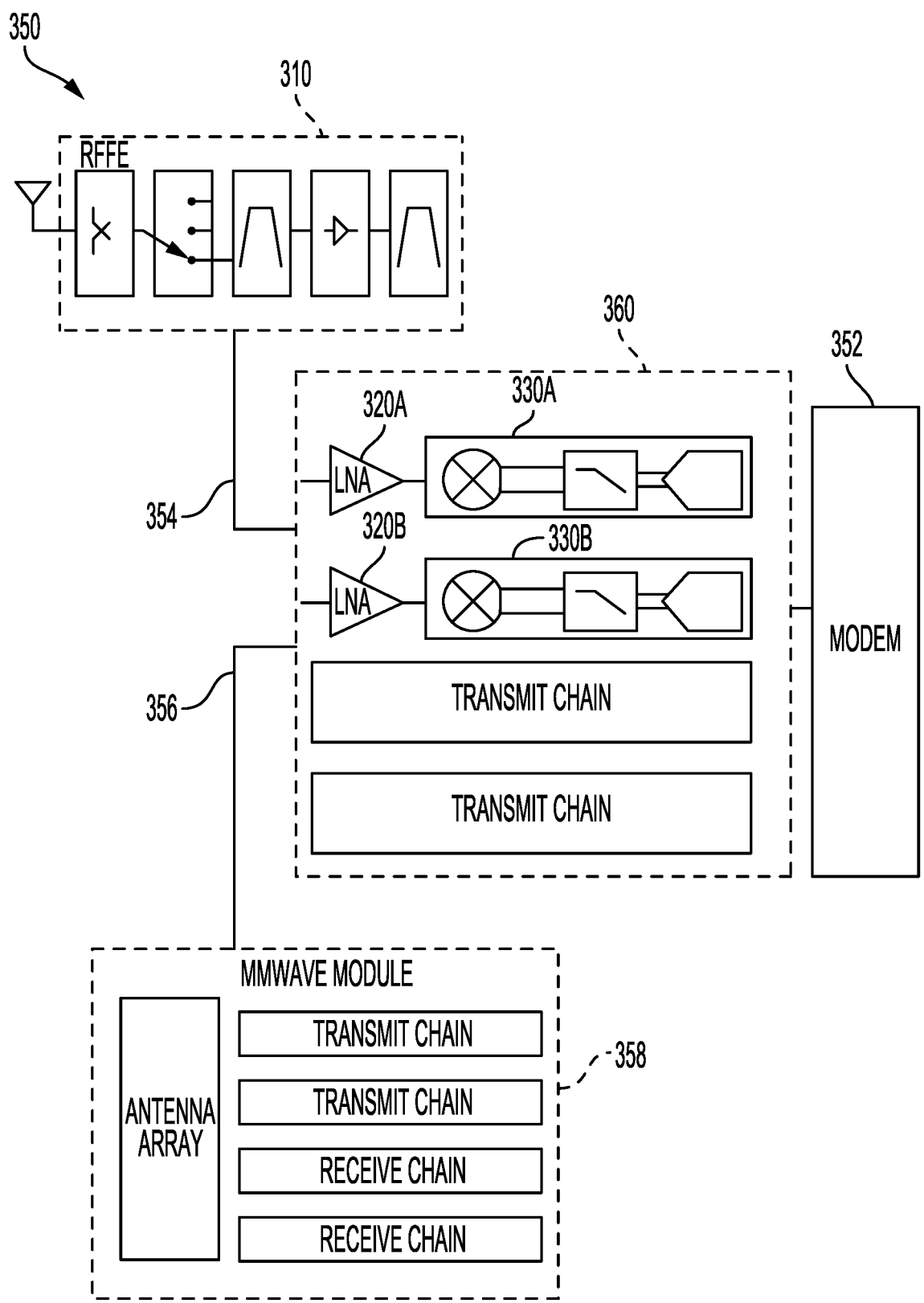
FIG. 3B is a block diagram illustrating a converged sub-6 Ghz and mmWave radio frequency (RF) transceiver according to one or more aspects.

The wireless receiver circuit of FIG. 3A may be implemented in some aspects in a wireless device as shown in FIG. 3B. FIG. 3B is a block diagram illustrating a wireless receiver circuit 300 according to one or more aspects. A wireless device 350 for performing wireless communications includes the RFFE 310 configured for receiving sub-6 GHz RF signals from one or more antennas, which may include one or more primary antennas and diversity antennas, and which may be configured to support multiple input multiple output (MIMO). In some embodiments, multiple RFFEs may be present and coupled to shared or different antennas or antenna arrays, such as different RFFE and antenna configurations for receiving and/or transmitting different frequencies of sub-6 GHz signals. The wireless device may also include a mmWave module 358. The mmWave module 358 may be configured to receive mmWave RF signals from one or more antennas of an antenna array. The RF signals may be processed through one or more receive chains to convert the mmWave RF signals to mmWave IF signals at a frequency level lower than the signal received at the antenna array. The mmWave module 358 may also include one or more transmit chains to configure the wireless device 350 for transmitting mmWave RF signals containing user and/or control data generated by a modem 352. The mmWave module 358 may also include beamforming circuitry, upconverters and/or downconverters (for converting between mmWave RF and mmWave IF signals), phase shifters, and/or a phased antenna array (e.g., patches or dipoles or the like).

The mmWave module 358 and the RFFE 310 may be coupled to a converged sub-6 GHz and mmWave wireless transceiver 360. The transceiver 360 may include amplifiers 320A and 320B and downconverters 330A and 330B for receiving sub-6 GHz RF signals and mmWave IF signals for downconversion to baseband. The baseband signals may be input to the modem 352 for processing to generate data and/or control information. The output of the modem 352 may be provided to one or more downstream processors, such as an application processor (AP) executing code to render content in the received data to the user. The transceiver 360 may also include transmit chains, which may include power amplifiers and upconverters, for generating sub-6 GHz RF signals and/or mmWave IF signals for output to the RFFE 310 and/or mmWave module 358 in which further circuitry outputs the signals to one or more antennas for transmission to other wireless devices, such as other UEs or a BS. Other configurations for the receiver circuit 300 are also contemplated.

Figure 4A:
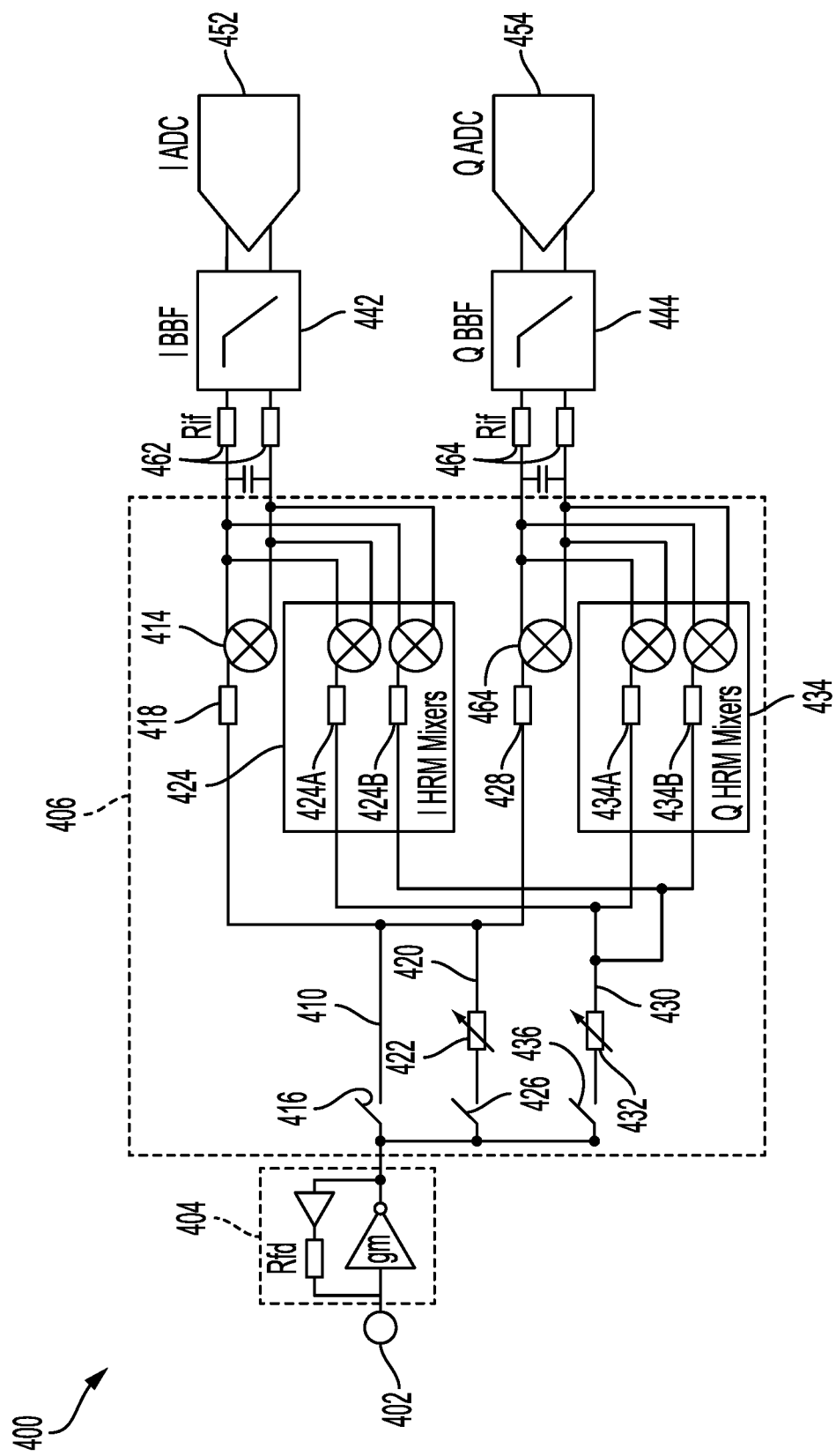
FIG. 4A is a block diagram illustrating a receiver with harmonic reject receivers (HRMs) according to one or more aspects of the disclosure.

One embodiment of a receiver circuit 300 includes the components shown as configured in FIG. 4A. FIG. 4A is a block diagram illustrating a receiver configuration with harmonic reject mixers (HRMs) and configurable degeneration components according to one or more aspects of the disclosure. A receiver circuit 400 includes an amplifier 404, a mixer path 406, interface resistors 462 and 464, baseband filters 442 and 444, and analog-to-digital converters (ADCs) 452 and 454. The receiver circuit 400 is configured in dual processing paths for a quadrature mixer with an I-channel and a Q-channel, although other receiver configurations involving mixers may use configurable degeneration components as described herein.

The mixer path 406 may include a first mixer block 424 including one or more mixers (e.g., forming an HRM or a portion of an HRM) in an I-channel path, each coupled to receive the mixer input signal from the input port 402 through degeneration components 424A-424B associated with individual mixers of the first mixer block 424. In some embodiments, one or more of the degeneration components are degeneration resistors (RRF) with configurable resistances (e.g., from 10-90 Ohms). In some embodiments, the degeneration components may include a bank of resistor elements of various values that can be switched between based on a control signal. In some embodiments, the degeneration components may include a resistor with multiple taps, each tap corresponding to a different resistance, with a control signal that selects a particular tap. In such embodiments, the first aspect controlled may be a resistance or impedance. In some embodiments, the degeneration components may include a capacitor or a capacitor bank. In such embodiments, the first aspect controlled may be a capacitance. The mixer path 406 may also include a second mixer block 434 including one or more mixers (e.g., forming an HRM or a portion of an HRM) in a Q-channel path, each coupled to receive the mixer input signal from the input port 402 through degeneration components 434A-434B, such as degeneration resistors ($R_{RF}$). The mixer blocks 424 and 434 may also be coupled to receive the mixer input signal from input port 402 through additional (e.g., second-stage) degeneration components, such as degeneration component 432 (e.g., a degeneration resistor $R_{RF}$). As noted, in some embodiments the degeneration component 432 may be configurable with different values (e.g., such as being a degeneration resistors (RRF) with a configurable resistance). It should be appreciated that in some embodiments all of the degeneration components may be configurable (e.g., have configurable or tunable/variable values) while in other embodiments just a portion of the degeneration components may be configurable. For example, the degeneration component 432 may be configurable while the degeneration components 424A, 424B, 434A, and 434B may be fixed. However, in other embodiments both degeneration component 432 and degeneration components 424A, 424B, 434A are configurable (e.g., are implemented to have configurable resistances). The configurable degeneration components may have certain fixed values for an aspect being controlled or may have a continuously adjustable aspect. The mixer blocks 424 and 434 may be configured with duty cycles of, e.g., 12.5%, 16.7%, 25%, or 33%.

The mixer path 406 may include a third mixer 414 for the I-channel path and a fourth mixer 464 for the Q-channel path, respectively, coupled in a separate signal path from the first mixer blocks 424 and 434. In some embodiments, the third and fourth mixers 414 and 464 may form a harmonic rejection mixer (HRM) together with the respective first and second mixer blocks 424 and 434 when operating in harmonic rejection mode. Each of the third and fourth mixers 414 and 464 may be coupled to receive the mixer input signal through degeneration components 418 and 428, respectively, such as degeneration resistors (RRF). In some embodiments, the degeneration components 418 and 428 may be configurable degeneration components, such as components with controlled variable resistance, capacitance, or inductance. As noted, in other embodiments, the degeneration components 418 and 428 could have fixed values where another configurable degeneration component in the path is present (e.g., degeneration component 422 which is described below).

Several processing paths through the mixer path 406 are possible through different combinations of the first and second mixer blocks 424 and 434 and the third and fourth mixers 414 and 464. A first processing path 430 may couple the mixer input signal to the first and second mixer blocks 424 and 434 through degeneration component 432 based on a configuration of switch 436. In embodiments in which the first and second mixer blocks 424 and 434 include multiple mixers, each of the mixers in mixer blocks 424 and 434 may receive the mixer input signal through the degeneration component 432. A second processing path 420 may couple the mixer input signal to the third and fourth mixers 414 and 464 through configurable degeneration component 422, such as a degeneration resistor ($R_{RF}$). A third processing path 410 may couple the mixer input signal to the third and fourth mixers 414 and 464 without degeneration component 422. Switches 416, 426, and 436 may configure the mixer path 406 for processing the mixer input signal through certain mixers and certain configurations. In some embodiments, the switches 416, 426, and 436 may be controlled through signals such that one, two, or three of the processing paths 410, 420, or 430, or combination thereof, may be enabled to control which mixer or which mixers of the mixers 414, 424, 464, and/or 434 perform downconversion of the mixer input signal received at 402. In example, in a harmonic rejection mixer configuration, the second and third processing paths 420 and 430 are enabled. In another configuration only the first processing path 410 is enabled. Other combinations may also be possible. Any one or more or all of degeneration components 422, 432, 418, and 428 may be configurable and controlled along with the operation of switches 414, 424, 464, and/or 434 to configure the mixer processing paths 410, 420, 430 to provide a receiver circuit 400 with particular characteristics that may be advantageous for the particular signal received at the mixer input port 402.

A controller (e.g., such as controller 340 of FIG. 3A) may couple to various elements of the receiver circuit 400 through control signals to configure the mixer path 406. For example, the controller may couple to the switches 416, 426, and/or 436 to control whether RF input signals are processed through one or more of processing paths 410, 420, 430. The controller may control the switches 416, 426, and/or 436 based on a carrier aggregation (CA) mode of operation for the wireless device containing the receiver circuit 400. For example, when RF input signals are received on 2G, 3G, 4G, or 5G bands in a non-CA scenario, the switches 426 and 436 may be opened to disable the second-stage degeneration component 422. In such a configuration, the switch 416 may be closed to configure the receiver circuit 400 for downconversion of the 2G, 3G, 4G, or 5G non-CA signals using third and fourth mixers 414 and 464 through degeneration components 418 and 428, respectively. When carrier aggregation is active between two bands in which one band may act as jammer, the switches 426 and 436 may be closed and switch 416 opened to configure the receiver circuit 400 for downconversion with degeneration component 422 and 432 with third and fourth mixers 414 and 464. Portions of certain carrier aggregation signals may be downconverted in third and fourth mixers 414 and 464 and other portions downconverted using first and second mixer blocks 424 and 434. The degeneration components 424A-B, 434A-B, 422, and 432 may be configured to values, such as particular resistance values, to reduce interference between the bands. In some embodiments, the controlled values for the degeneration components 424A-B, 434A-B, 422, and 432 may configure the first and second mixer blocks 424 and 434 between an upconversion mode and a downconversion mode. There may also be further scenarios in a non-CA mode or otherwise where the controller is configured to configure the receiver circuit (e.g., to close switches 426 and 436 with switch 416 open) for downconversion with degeneration component 422 and 432 with the third and fourth mixers 414 and 464 as well as the first and second mixer blocks 424 and 434.

Control of the receiver circuit 400 may also be performed to reduce power consumption by the receiver circuit 400 based on the operating mode. For example, operating in a non-CA mode, the first and second mixer blocks 424 and 434 may be disabled. The disabling may include disconnecting a supply voltage to the first and second mixer blocks 424 and 434. As another example, the local oscillator (LO) for the first and second mixer blocks 424 and 434 may be disabled when in a non-CA mode.

Control of the receiver circuit 400 may also include control over a gain ratio of the amplifier 404 of receiver circuit 400. The gain levels can be configured based on one or more parameters, including, for example, whether the receiver circuit 400 is configured in a downconversion or upconversion mode. In some embodiments, gain may be controlled on a per-mixer basis, such that gain can be individually controlled for one or more of mixers 414 and 464 and/or mixers in mixer blocks 424 and 434.

Figure 4B:
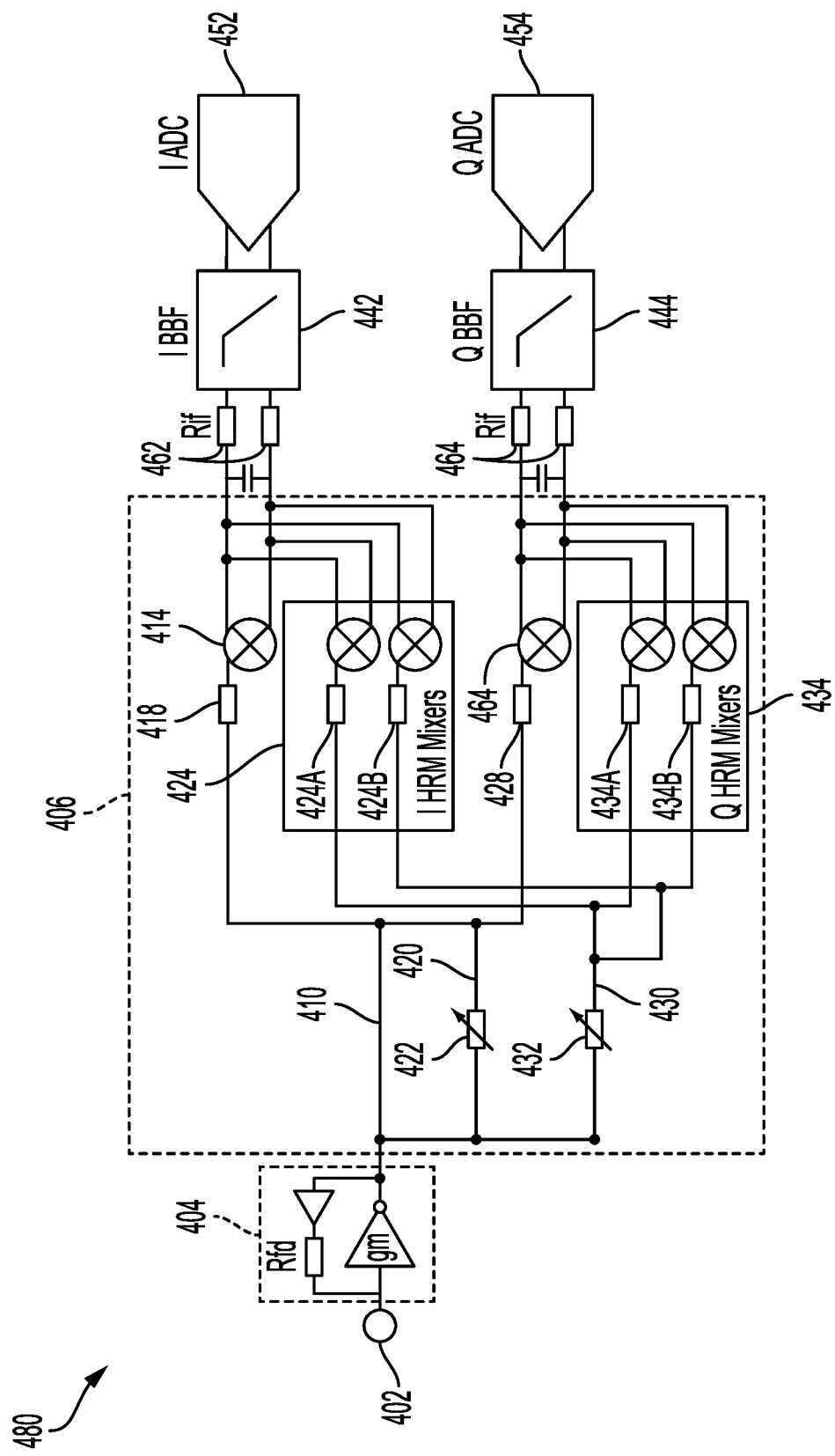
FIG. 4B is a block diagram illustrating a receiver with harmonic reject receivers (HRMs) according to one or more aspects of the disclosure.

Other configurations for a receiver circuit 400 may provide control over the downconverting of the mixer input signal using HRM mixers and configurable degeneration components. FIG. 4B is a block diagram illustrating a receiver configuration with harmonic reject mixers (HRMs) and configurable degeneration components according to one or more aspects of the disclosure. A receiver circuit 480 is similar to that of FIG. 4A without the switches 416, 426, and 436. The configurable degeneration components 422 and 432 may be controlled to adjust signal flow through the processing paths of 410, 420 and/or 430 through the mixer path 406. For example, for processing through mixers 414 and 464, the configurable degeneration components 422 and 432 may be configured with high impedances to effectively disconnect processing paths 420 and 430. In addition, in certain configurations the degeneration components 422 and 432 may be merged with one or more of the degeneration components 424A, 424B, 434A, 434B (e.g., degeneration component 422 merged with degeneration components 418 and 428).

Other configurations of switches may be used in other embodiments to configure the mixer path 406. For example, switches may be coupled between the degeneration components 422 and 432 and the mixer blocks 424 and 434 to control operation of processing paths 420 and 430. As another example, a switch may be coupled on a common path between the amplifier 404 and the degeneration components 422 and 432, such that the processing paths 420 and 430 may potentially be enabled simultaneously. In some configurations, such a switch may be closed to enable processing paths 420 and 430, but one of the configurable degeneration components 422 and 432 may be configured for high impedance to effectively disable one of the processing paths 420 or 430. In any receiver circuit 400 with HRM mixers configured for different modes, one or more or all degeneration components may be configurable degeneration components.

The selection of upconversion mode or downconversion mode for the mixers may allow improved reduction of de-sense from jammer signals. For example, the receiver circuit 400 may be configured in an upconversion HRM mixer mode. In this mode, at least a portion or all of the degeneration components 424A-B, 434A-B, 418, 428, 422, and/or 432 are configured (e.g., values tuned/adjusted) such that the mixers suppress upconversion of one or more harmonics (e.g., third and/or fifth harmonics) based on degeneration component values. In one example scenario involving carrier aggregation (CA) operation with n21 band (with receive frequency of approximately 1.5 GHz and transmit frequency of approximately 1.45 GHz) and n257 band (with a potential IF frequency of 7.5 GHz), the receiver circuit 400 may be configured in an upconversion HRM mixer mode. Processing of the n21 band may create a 4LO+TX jammer signal when processing the n257 band signal. Configuring the degeneration components 424A-B, 434A-B, 418, 428, 422, and/or 432 for an upconversion mode can reduce the magnitude of the jammer by −60 dBm instead of −24 dBm (e.g., the mixers suppress upconversion of one or more harmonics (e.g., third an/or fifth harmonics) based on degeneration component values).

The receiver circuit 400 may also be configured in a downconversion HRM mixer mode. In this mode, at least a portion or all of the degeneration components 424A-B, 434A-B, 418, 428, 422, and/or 432 are configured (e.g., values tuned/adjusted) for a downconversion mode such that the mixers suppress downconversion of one or more harmonics based on degeneration component values. For example, in another example scenario involving carrier aggregation (CA) operation with n71 band (with receive frequency of approximately 630 MHz) and n2 band (with transmit frequency of approximately 1890 MHz), the receiver circuit 400 may be configured in a downconversion HRM mixer mode. Processing of the n2 band may cause leakage into the n71 band, but the degeneration components 424A-B, 434A-B, 418, 428, 422, and/or 432 may be adjusted to reduce the strength of the jammer signal. The downconversion mode for the receiver circuit 400 can reject the n2 band transmission signal that jams the n71 band signal because the n2 band is at the third harmonic of n71. Independent control of the degeneration components 424A-B, 434A-B, 418, 428, 422, and/or 432, such as through separate signal lines to the components, may facilitate the flexible configuration of the receiver circuit 400. Examples of frequencies are provided herein but are not intended to be limiting of the disclosed embodiments. For example, different IF frequencies may be used for processing the n257 band. Likewise different IF frequencies may be used for other frequency bands depending on implementation of the receiver.

A receiver circuit, such as that of FIG. 4, may be configured into several modes, including a non-HRM mode (e.g., through processing path 410 of receiver circuit 400), a first HRM mode that prioritizes suppressing upconversion (e.g., through processing paths 420 and 430 of receiver circuit 400 with degeneration components configured with first values), a second HRM mode that prioritizes suppressing downconversion (e.g., through processing paths 420 and 430 of receiver circuit 400 with degeneration components configured with second values), and/or a third HRM mode that prioritizes suppressing upconversion (e.g., through processing paths 420 and 430 of receiver circuit 400 with degeneration components configured with second values). Example methods for controlling a reconfigurable receiver circuit during operation of a wireless device are shown in FIG. 5 and FIG. 6.

Figure 5:
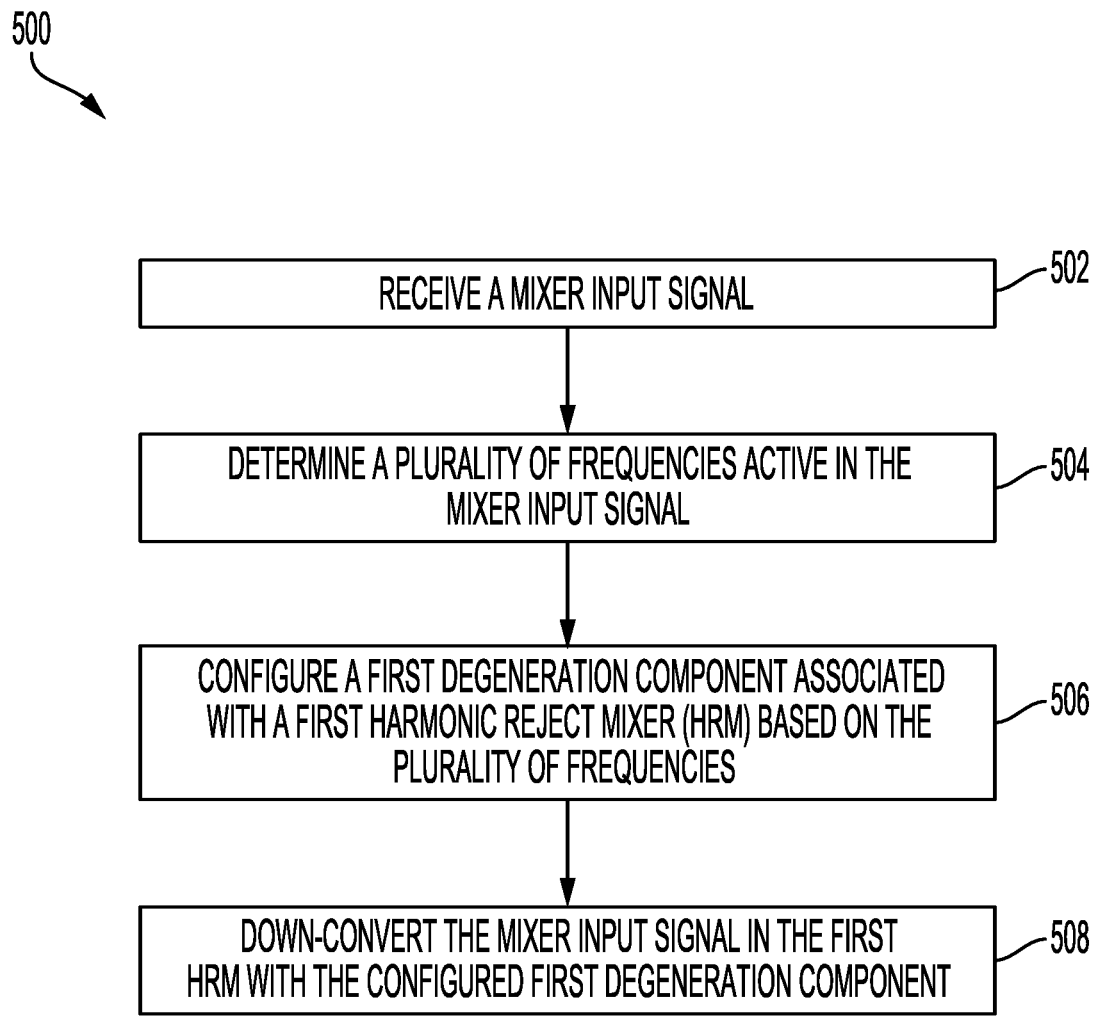
FIG. 5 is a flow chart illustrating a method of configuring degeneration components of a receiver circuit for HRM operation according to one or more aspects of the disclosure.
Figure 6:
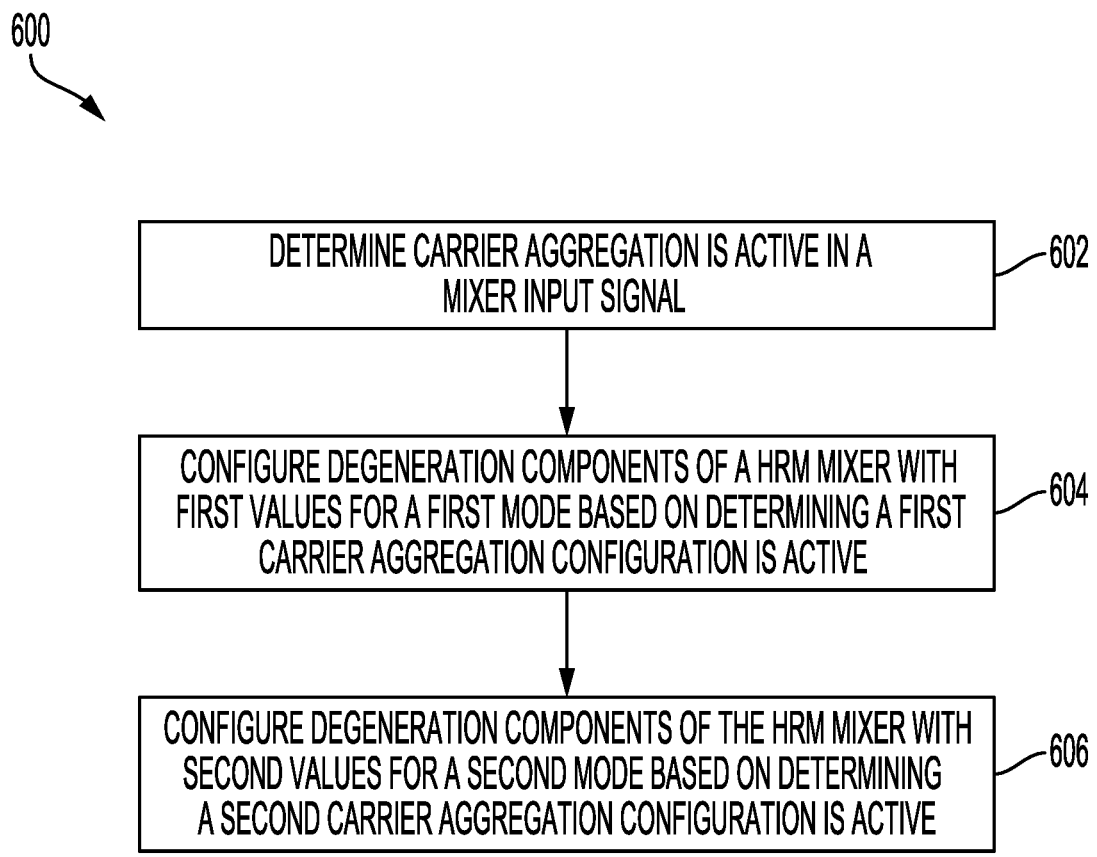
FIG. 6 is a flow chart illustrating a method of configuring degeneration components of a receiver circuit for HRM operation based on a carrier aggregation (CA) configuration according to one or more aspects of the disclosure.

FIG. 5 is a flow chart illustrating a method of configuring degeneration components of a receiver circuit for HRM operation according to one or more aspects of the disclosure. A method 500 includes, at block 502, receiving a mixer input signal at the mixer, such as mixer 332 of FIG. 3A, to be downconverted, referred to as a mixer input signal. At block 504, a plurality of frequencies active in the mixer input signal are determined, such as by controller 340 of FIG. 3A. In some embodiments, the active frequencies may be determined from information regarding the radio configuration, such as configured bands for operation, bands active in a cell, and/or bands associated with received downlink (DL) grants, carrier aggregation (CA) configurations, and/or bandwidth parts (BWPs). The radio configuration may be retrieved from a memory device of the wireless device or from a communications processor of the wireless device. In some embodiments, the controller 340 may be integrated in a communications processor. In some embodiments, the active frequencies may be determined by measuring signals in the mixer input signal. The measurements may be performed by circuitry in, or circuitry coupled to, the RF front end (RFFE) 310. In some embodiments, the active frequencies may be determined based on a configuration of an RF front end (RFFE) at the time of reception of an RF input signal before input to the mixer as the mixer input signal. For example, the determination of active frequencies may be based on which LNAs are enabled in the RFFE and/or a configuration of a mux switch in the RFFE. At block 506, a first degeneration component associated with a first harmonic rejection mixer (HRM) may be configured based on the active frequencies determined at block 504. The controller 340 may perform the configuring of block 506 through one or more control signals coupling the controller 340 to the degeneration components in downconverters 330A, 330B, and/or 330C. For example, the active frequencies may be used to determine the presence of frequencies that may interfere with each other, such as when one active frequency is located at a frequency that is a higher-order (e.g., third or fifth) harmonic of another active frequency. The degeneration components may be configured with values to reduce interference between the frequency bands. In some embodiments, a look-up table may be implemented such that a controller may look-up degeneration component values in the table based on the active frequencies. Identifying a row in the table corresponding to two active frequencies may indicate that the two frequency bands may interfere with each other. After configuring the receiver circuit degeneration components at block 506, the mixer input signal may be downconverted in the first HRM with the configured first degeneration component at block 508. The method 500 may loop through blocks 504, 506, and 508, to change degeneration component values in the receiver circuit configuration according to changing active frequencies in the mixer input signal.

The RF transceiver configuration may be based on a carrier aggregation configuration to switch the HRM mixers from a first mode that prioritizes suppressing downconversion and a second mode that prioritizes suppressing upconversion. FIG. 6 is a flow chart illustrating a method of configuring degeneration components of a receiver circuit for HRM operation based on a carrier aggregation (CA) configuration according to one or more aspects of the disclosure. A method 600 includes, at block 602, determining carrier aggregation is active in a mixer input signal. The determination may include determining whether the CA configuration includes a combination of sub-6 GHz signals and mmWave signals either on or between transmit and receive configurations. At block 604, degeneration components of an HRM mixer may be configured with first values for a first mode based on determining one of a first set of CA configurations is active. At block 606, degeneration components of an HRM mixer may be configured with second values for a second mode based on determining one of a second set of CA configurations is active. The first and second values may include, for example, specific resistor values for the degeneration resistors used as degeneration components. For example, the first and second values may correspond to values for first and second modes of operation for the mixer, in which the first and second modes of operation may correspond to a first configuration for suppressing upconversion harmonics and a second configuration for suppressing downconversion harmonics. Each of the operations of method 600 may be performed, for example, by the controller 344 of FIG. 3A through control signals to degeneration components within downconverters 330A, 330B, and/or 330C.

Operations of method 500 or method 600 may be performed by a UE, such as UE 115 described above with reference to FIG. 1 or FIG. 2, or a UE described with reference to FIG. 7. For example, example operations (also referred to as "blocks") of method 500 and method 600 may enable UE 115 to support carrier aggregation operations with reduced interference.

Figure 7:
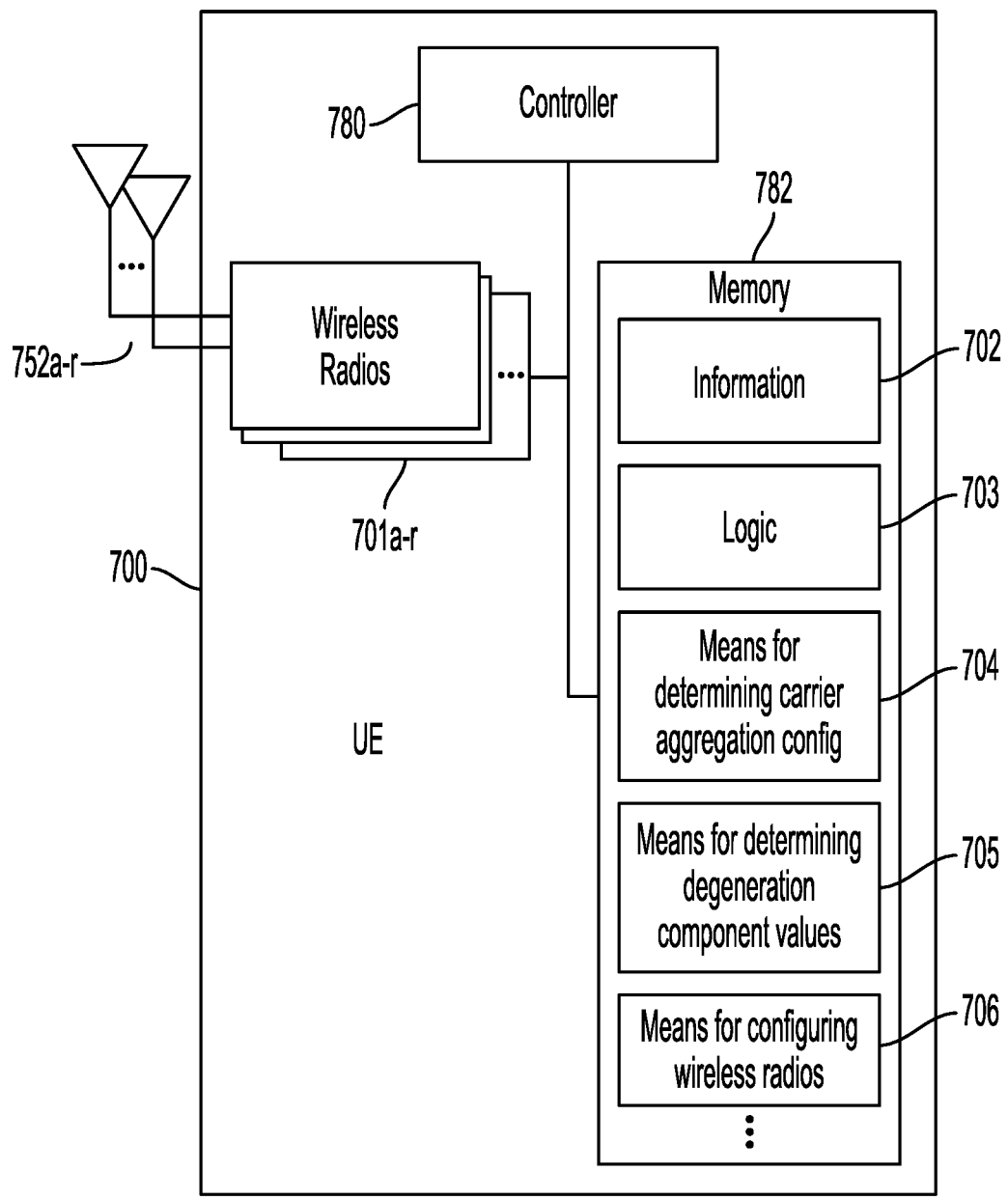
FIG. 7 is a block diagram of an example UE that supports reconfiguring a downconverter of a wireless radio according to one or more aspects of the disclosure.

FIG. 7 is a block diagram of an example UE 700 that supports reconfiguring a downconverter of a wireless radio according to one or more aspects of the disclosure. UE 700 may be configured to perform operations, including the blocks of a process described with reference to FIGS. 5 or FIG. 6. In some implementations, UE 700 includes the structure, hardware, and components shown and described with reference to UE 115 of FIG. 1 or FIG. 2. For example, UE 500 includes controller 780, which operates to execute logic or computer instructions stored in memory 782, as well as controlling the components of UE 700 that provide the features and functionality of UE 700. UE 700, under control of controller 780, transmits and receives signals via wireless radios 701a-r and antennas 752a-r. Wireless radios 701a-r include various components and hardware, as illustrated in FIG. 2 for UE 115, including modulator and demodulators 254a-r, MIMO detector 256, receive processor 258, transmit processor 264, and TX MIMO processor 266. Wireless radios 701a-r may also include one or more receiver circuits with downconverters configured as shown in FIG. 4.

As shown, memory 782 may include information 702, logic 703, means for determining carrier aggregation configuration 704, means for determining degeneration component values 705, and/or means for configuring wireless radios 706. Information 702 may be configured to include, for example, component values for corresponding sets of active frequencies and/or carrier aggregation sets. Logic 703 may be configured to process the information 702, update the information 702, generate new configuration data for information 702, and/or store information regarding the current operating mode, e.g., assigned DL grants and/or BWPs. Means for determining carrier aggregation 704 may be configured to receive information from the wireless radios 701a-r, from the controller 780, and/or from information 702 to determine active frequencies in a carrier aggregation configuration for the UE 700. Means for determining degeneration component values 705 may be configured to determine degeneration component values based on the determined wireless radio configuration from block 704. For example, block 705 may obtain appropriate information from a lookup table stored in information 702 using the configuration determined by block 705 as an index into the look-up table. Means for configuring wireless radios 706 may use the values determined by block 705 to change the configuration of one or more of the wireless radios 701a-r, such as through the controller 780. In some embodiments, some of the wireless radios 701a-r may be configured for mmWave operation and other of the wireless radios 701a-r may be configured for sub-6 GHz operation. The means for determining degeneration component values 705 may use information regarding the physical location of certain wireless radios 701a-r relative to other wireless radios 710a-r to determine the degeneration component values. For example, the closeness of a mmWave wireless radio and a sub-6 GHz wireless radio may be used to determine whether interference may be generated between two frequency bands being processed through the wireless radios 701*a-r*. UE 700 may receive signals from or transmit signals to one or more network entities, such as base station 105 of FIG. 1 or FIG. 2 or a base station as illustrated in FIG. 8.

Figure 8:
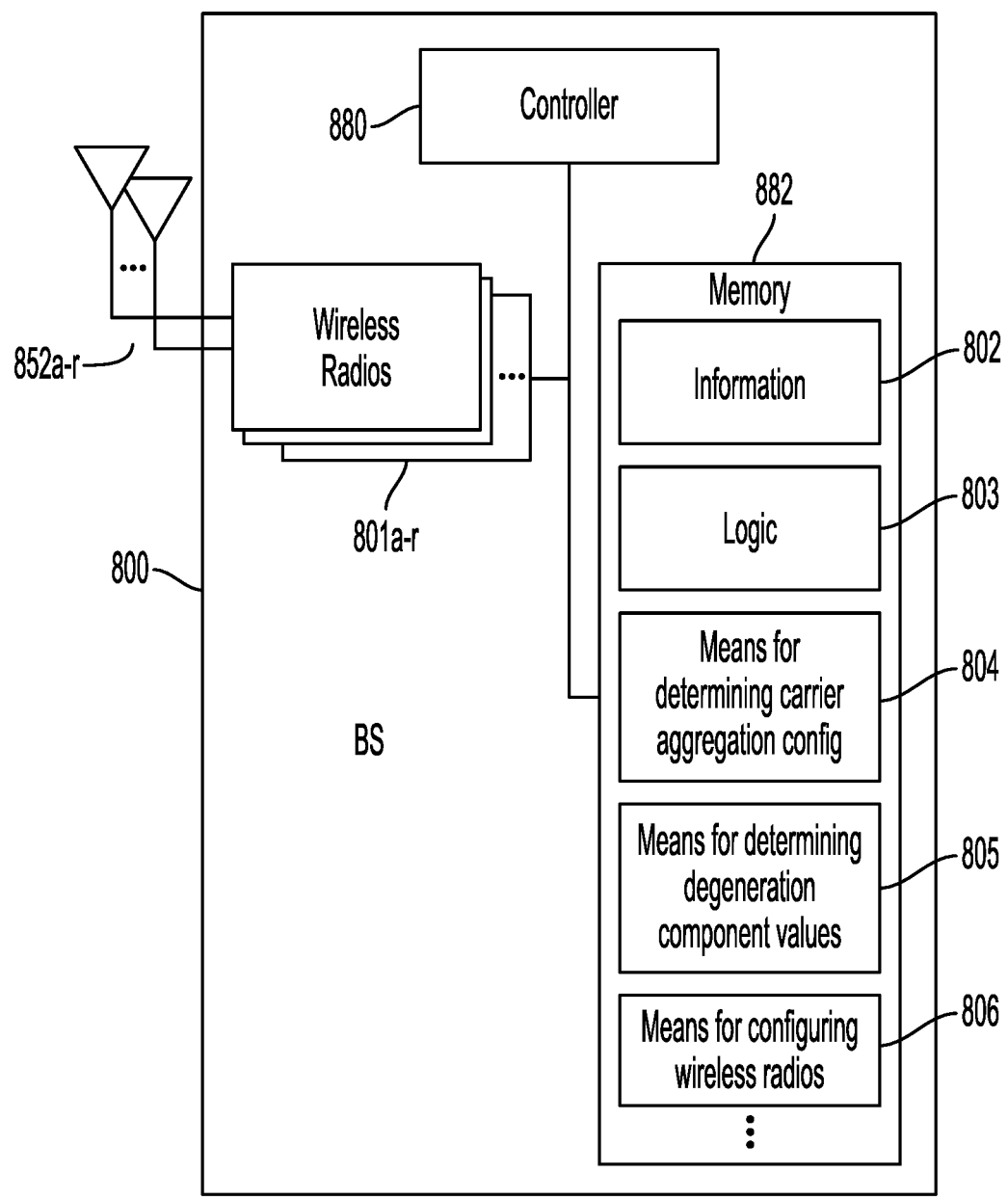
FIG. 8 is a block diagram of an example base station that supports reconfiguring a downconverter of a wireless radio according to one or more aspects of the disclosure.

FIG. 8 is a block diagram of an example base station 800 that supports reconfiguring a downconverter of a wireless radio according to one or more aspects of the disclosure. Base station 800 may be configured to perform operations, including the blocks of method 500 or method 600 described with reference to FIG. 5 or FIG. 6. In some implementations, base station 800 includes the structure, hardware, and components shown and described with reference to base station 105 of FIG. 1 or FIG. 2. For example, base station 800 may include controller 240, which operates to execute logic or computer instructions stored in memory 242, as well as controlling the components of base station 800 that provide the features and functionality of base station 800. Base station 800, under control of controller 240, transmits and receives signals via wireless radios 801*a-t* and antennas 834*a-t*. Wireless radios 801*a-t* include various components and hardware, as illustrated in FIG. 2 for base station 105, including modulator and demodulators 232*a-t*, transmit processor 220, TX MIMO processor 230, MIMO detector 236, and receive processor 238. Wireless radios 801*a-r* may also include one or more receiver circuits with downconverters configured as shown in FIG. 4.

As shown, memory 882 may include information 802, logic 803, means for determining carrier aggregation configuration 804, means for determining degeneration component values 805, and/or means for configuring wireless radios 806. Information 802 may be configured to include, for example, component values for corresponding sets of active frequencies and/or carrier aggregation sets. Logic 803 may be configured to process the information 802, update the information 802, generate new configuration data for information 802, and/or store information regarding the current operating mode, e.g., assigned DL grants and/or BWPs. Means for determining carrier aggregation 804 may be configured to receive information from the wireless radios 801*a-r*, from the controller 880, and/or from information 802 to determine active frequencies in a carrier aggregation configuration for the BS 800. Means for determining degeneration component values 805 may be configured to determine degeneration component values based on the determined wireless radio configuration from block 804. For example, block 805 may obtain appropriate information from a lookup table stored in information 802 using the configuration determined by block 805 as an index into the look-up table. Means for configuring wireless radios 806 may use the values determined by block 805 to change the configuration of one or more of the wireless radios 801*a-r*, such as through the controller 880. In some embodiments, some of the wireless radios 801*a-r* may be configured for mmWave operation and other of the wireless radios 801*a-r* may be configured for sub-6 GHz operation. The means for determining degeneration component values 805 may use information regarding the physical location of certain wireless radios 801*a-r* relative to other wireless radios 810*a-r* to determine the degeneration component values. For example, the closeness of a mmWave wireless radio and a sub-6 GHz wireless radio may be used to determine whether interference may be generated between two frequency bands being processed through the wireless radios 801*a-r*. Base station 800 may receive signals from or transmit signals to one or more UEs, such as UE 115 of FIG. 1 or FIG. 2 or UE 700 of FIG. 7.

It is noted that one or more blocks (or operations) described with reference to FIG. 5 or FIG. 6 may be combined with one or more blocks (or operations) described with reference to another of the figures. For example, one or more blocks (or operations) of FIG. 5 may be combined with one or more blocks (or operations) of FIG. 6. As another example, one or more blocks associated with FIG. 4 may be combined with one or more blocks (or operations) associated with FIG. 5 or FIG. 6. Additionally, or alternatively, one or more operations described above with reference to FIG. 1, FIG. 2, or FIG. 4 may be combined with one or more operations described with reference to FIG. 7 or FIG. 8.

In one or more aspects, techniques for supporting wireless communications, such as on multiple frequency bands, may include additional aspects, such as any single aspect or any combination of aspects described below or in connection with one or more other processes or devices described elsewhere herein. In a first aspect, supporting wireless communication may include an apparatus with a configurable mixer path with one or more configurable degeneration components. Additionally, the apparatus may perform or operate according to one or more aspects as described below. In some implementations, the apparatus includes a wireless device, such as a UE or a base station (BS). In some implementations, the apparatus may include at least one processor, and a memory coupled to the processor. The processor may be configured to perform operations described herein with respect to the apparatus, including operations described herein with respect to methods of operating a wireless device. In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein. In some implementations, a method of wireless communication may include one or more operations described herein with reference to the apparatus.

In a first aspect, an apparatus may include an input port configured to receive a mixer input signal; a first mixer forming at least a portion of a harmonic rejection mixer (HRM); a first configurable degeneration component of a first processing path coupled between the input port and the first mixer; and/or a controller coupled to the first configurable degeneration component, wherein the controller is configured to control a first aspect of the first configurable degeneration component.

In a second aspect, in combination with the first aspect, the controller is configured to control the first aspect of the first degeneration component to a first value to suppress upconversion harmonics in a first mode; and/or control the first aspect of the first degeneration component to a second value to suppress downconversion harmonics in a second mode.

In a third aspect, in combination with one or more of the first aspect or the second aspect, the apparatus may include a second mixer, a second configurable degeneration component of a second processing path coupled between the input port and the second mixer, and/or a first switch in the second processing path coupled between the input port and the second configurable degeneration component.

In a fourth aspect, in combination with one or more of the first aspect through the third aspect, the controller may be coupled to the first switch and configured to control the first switch to toggle processing of the mixer input signal in the second processing path based on content of the mixer input signal.

In a fifth aspect, in combination with one or more of the first aspect through the fourth aspect, the second processing path comprises a third configurable degeneration component coupled between the first switch and the second configurable degeneration component, and the apparatus may further comprise a second switch in a third processing path coupled between the input port and the second configurable degeneration component, wherein the controller is coupled to the second switch and configured to toggle between coupling the input port to the second mixer through the second processing path and coupling the input port to the second mixer through the third processing path.

In a sixth aspect, in combination with one or more of the first aspect through the fifth aspect, the apparatus may include a third degeneration component in the first processing path between the input port and the first configurable degeneration component, and wherein the controller is coupled to the third degeneration component and configured to control a first aspect of the third degeneration component.

In a seventh aspect, in combination with one or more of the first aspect through the sixth aspect, the apparatus may include a third mixer comprising a HRM mixer coupled to the input port, a fourth configurable degeneration component coupled between the third mixer and the input port, wherein the controller is coupled to the fourth degeneration component and configured to control a first aspect of the fourth degeneration component.

In an eighth aspect, in combination with one or more of the first aspect through the seventh aspect, the controller is configured to independently control the first aspect of the first degeneration component, the first aspect of the second degeneration component, the first aspect of the third degeneration component, and the first aspect of the fourth degeneration component.

In a ninth aspect, in combination with one or more of the first aspect through the eighth aspect, the first configurable degeneration component comprises a component comprises a variable resistor.

In a tenth aspect, in combination with one or more of the first aspect through the ninth aspect, the apparatus includes a second degeneration component coupled in series to the first configurable degeneration component and the first mixer.

In an eleventh aspect, in combination with one or more of the first aspect through the tenth aspect, the second degeneration component comprises a second configurable degeneration component, and wherein the controller is configured to control a first aspect of the second configurable degeneration component.

In a twelfth aspect, in combination with one or more of the first aspect through the eleventh aspect, the controller is configured to suppress upconversion harmonics on a third harmonic and a fifth harmonic in the first mode and configured to suppress downconversion harmonics on the third harmonic and the fifth harmonic in the second mode.

In a thirteenth aspect, in combination with one or more of the first aspect through the twelfth aspect, the upconversion harmonics in the first mode correspond to a third harmonic and a fifth harmonic in the first mode.

In a fourteenth aspect, in combination with one or more of the first aspect through the thirteenth aspect, the controller is configured to control the first configurable degeneration component in the first mode when the controller determines the mixer input signal comprises a carrier aggregation combination of a first band and a second band, the first band having one or more harmonics that at least partially overlap the second band.

In a fifteenth aspect, in combination with one or more of the first aspect through the fourteenth aspect, the controller is configured to control the first configurable degeneration component in the first mode when the controller determines the mixer input signal comprises a carrier aggregation combination of n21 and n257 bands.

In a sixteenth aspect, in combination with one or more of the first aspect through the fifteenth aspect, the controller is configured to control the first configurable degeneration component in the second mode when the controller determines the mixer input signal comprises a carrier aggregation combination of n71 and n2 bands.

In a seventeenth aspect, in combination with one or more of the first aspect through the sixteenth aspect, the apparatus includes a baseband filter (BBF) coupled to the first mixer through differential outputs of the first mixer; a first resistor coupled between the first mixer and the baseband filter on a first output of the differential outputs; a second resistor coupled between the first mixer and the baseband filter on a second output of the differential outputs; and/or a capacitor coupled between the differential outputs of the first mixer.

In an eighteenth aspect, in combination with one or more of the first aspect through the seventeenth aspect, the apparatus includes at least one low noise amplifier (LNA) comprising a first LNA coupled to the input port and configured to amplify an input signal for output as the mixer input signal.

In a nineteenth aspect, in combination with one or more of the first aspect through the eighteenth aspect, the input port, the first mixer, and the first configurable degeneration component comprise a first downconverter, and wherein the apparatus comprises a plurality of downconverters coupled to the at least one low noise amplifier (LNA).

In a twentieth aspect, the apparatus comprises a user equipment (UE) or a base station (BS).

In a twenty-first aspect, the apparatus includes means for determining a carrier aggregation (CA) configuration of a mixer input signal, means for controlling a first degeneration component of a first mixer based on the CA configuration and for controlling a second degeneration component of a second mixer based on the CA configuration, first means for downconverting the mixer input signal, and/or second means for downconverting the mixer input signal.

In a twenty-second aspect, in combination with one or more of the first aspect through the twenty-first aspect, the means for determining the CA configuration comprises at least one of: means for measuring a plurality of frequencies active in the mixer input signal; and/or means for receiving an indication of the CA configuration from a higher level.

In a twenty-third aspect, in combination with one or more of the first aspect through the twenty-second aspect, the means for controlling comprises means for suppressing upconversion harmonics in a first mode and for suppressing downconversion harmonics in a second mode.

In a twenty-fourth aspect, in combination with one or more of the first aspect through the twenty-third aspect the means for determining a CA configuration of an RF input signal comprises means for determining the CA configuration comprises a first frequency band and a second frequency band at a third or fifth harmonic of the first frequency band, wherein the means for controlling suppresses interference between the first frequency band and the second frequency band.

In a twenty-fifth aspect, in combination with one or more of the first aspect through the twenty-fourth aspect, the apparatus includes a first mixer coupled between an output of a low noise amplifier (LNA) and a node at an input to a baseband circuit; a second mixer coupled between the output of the LNA and the node at the input of the baseband circuit; and/or a first degeneration component coupled between the output of the LNA and the second mixer, the second mixer configured to suppress upconversion of one or more harmonics based at least on a value of the first degeneration component.

In a twenty-sixth aspect, in combination with one or more of the first aspect through the twenty-fifth aspect, the first degeneration component comprises a first configurable degeneration component, the apparatus further comprising a controller configured to control a first aspect of the first configurable degeneration component in a first mode to suppress upconversion of the one or more harmonics.

In a twenty-seventh aspect, in combination with one or more of the first aspect through the twenty-sixth aspect, the controller is configured to control the first aspect of the first configurable degeneration component such that the second mixer is configured to suppress downconversion harmonics in a second mode.

In a twenty-eighth aspect, in combination with one or more of the first aspect through the twenty-seventh aspect, the apparatus includes a second degeneration component coupled between the output of the LNA and the first mixer, wherein the second degeneration component comprises a second configurable degeneration component.

In a twenty-ninth aspect, in combination with one or more of the first aspect through the twenty-eighth aspect, the apparatus includes a third mixer coupled between the output of the low noise amplifier and the node at the input of the baseband circuit, wherein the first degeneration component is coupled between the output of the low noise amplifier and the third mixer.

In a thirtieth aspect, in combination with one or more of the first aspect through the twenty-ninth aspect, the apparatus includes a first switch coupled between the output of the LNA and the first mixer.

In a thirty-first aspect, in combination with one or more of the first aspect through the thirtieth aspect, the apparatus includes a second degeneration component coupled between the output of the LNA and the first mixer; and/or a second switch coupled between the output of the LNA and the second degeneration component.

In a thirty-second aspect, in combination with one or more of the first aspect through the thirty-first aspect, the first degeneration component is a first configurable degeneration component, the apparatus further comprising a controller configured to control a first aspect of the first configurable degeneration component based on a carrier aggregation operating mode.

In a thirty-third aspect, in combination with one or more of the first aspect through the thirty-second aspect, the controller is configured to control the first aspect of the first configurable degeneration component in response to a change in a carrier aggregation operating mode such that the second mixer is configured to suppress downconversion harmonics.

In one or more aspects, techniques for supporting wireless communications may include additional aspects, such as any single aspect or any combination of aspects described below or in connection with one or more other processes or devices described elsewhere herein. In a thirty-fourth aspect, supporting wireless communication may include a method including down-converting a mixer input signal through a first degeneration component and a harmonic rejection mixer (HRM). The method may be performed by a controller, a processor, and/or an apparatus, including the apparatus described in one of the aspects herein. Additionally, the method may include one or more aspects as described below. In some implementations, the method is performed by a wireless device, such as a UE or a base station (BS). In some implementations, the apparatus may include at least one processor, and a memory coupled to the processor. The processor may be configured to perform operations described herein with respect to the apparatus. In some other implementations, the method may be in a non-transitory computer-readable medium having program code recorded thereon and the program code may be executable by a computer for causing the computer to perform operations described herein with reference to the method. In some implementations, an apparatus for performing aspects of the methods described herein may include one or more means configured to perform operations described herein. In some implementations, a method of wireless communication may include one or more operations described herein with reference to the apparatus.

In a thirty-fourth aspect, alone or in combination with one or more of the first aspect through the thirty-third aspect, a method may include receiving a mixer input signal; determining a plurality of frequencies active in the mixer input signal; configuring a first degeneration component associated with a first mixer forming at least a portion of a harmonic rejection mixer (HRM) based on the plurality of frequencies; and/or down-converting the mixer input signal in the first mixer.

In a thirty-fifth aspect, in combination with one or more of the first aspect through the thirty-fourth aspect, configuring a first degeneration component of the first mixer comprises: controlling a first aspect of the first degeneration component to a first value to suppress upconversion harmonics in a first mode; and/or controlling the first aspect of the first degeneration component to a second value to suppress downconversion harmonics in a second mode.

In a thirty-sixth aspect, in combination with one or more of the first aspect through the thirty-fifth aspect, the method includes configuring a second degeneration component of a second mixer based, at least in part, on the plurality of frequencies; and/or down-converting the mixer input signal in the second mixer.

In a thirty-seventh aspect, in combination with one or more of the first aspect through the thirty-sixth aspect, down-converting the mixer input signal in the second mixer comprises toggling a switch to pass the mixer input signal through an additional degeneration component associated with the second mixer.

In a thirty-eighth aspect, alone or in combination with one or more of the first aspect through the thirty-seventh aspect, a method may include determining a carrier aggregation (CA) configuration of a mixer input signal; controlling a first degeneration component of a first mixer based on the CA configuration; controlling a second degeneration component of a second mixer based on the CA configuration; and/or downconverting the mixer input signal through the first mixer and the second mixer.

In a thirty-ninth aspect, in combination with one or more of the first aspect through the thirty-eighth aspect, determining the CA configuration comprises at least one of: measuring a plurality of frequencies active in the mixer input signal; and/or receiving an indication of the CA configuration from a higher level.

In a fortieth aspect, in combination with one or more of the first aspect through the thirty-ninth aspect, the first degeneration component and the second degeneration component are controlled to suppress upconversion harmonics in a first mode and/or the first degeneration component and the second degeneration component are controlled to suppress downconversion harmonics in a second mode.

In a forty-first aspect, in combination with one or more of the first aspect through the fortieth aspect, determining a CA configuration of an RF input signal comprises determining the CA configuration comprises a first frequency band and a second frequency band, wherein the second frequency band is at a third harmonic or fifth harmonic of the first frequency band; and/or controlling the first degeneration component and the second degeneration component to suppress interference between the first frequency band and the second frequency band.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-8 include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, that is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus, comprising:
   an input port configured to receive a mixer input signal;
   a first mixer forming at least a portion of a harmonic rejection mixer (HRM);
   a first configurable degeneration component of a first processing path coupled between the input port and the first mixer; and
   a controller coupled to the first configurable degeneration component, wherein the controller is configured to control a first aspect of the first configurable degeneration component to a first value to suppress upconversion harmonics in a first mode or to a second value to suppress downconversion harmonics in a second mode when the controller determines the mixer input signal comprises a carrier aggregation combination of a first band and a second band, the first band having one or more harmonics that at least partially overlap the second band.

2. The apparatus of claim 1, further comprising:
   a second mixer;
   a second configurable degeneration component of a second processing path coupled between the input port and the second mixer; and
   a first switch in the second processing path coupled between the input port and the second configurable degeneration component.

3. The apparatus of claim 2, wherein the controller is coupled to the first switch and configured to control the first switch to toggle processing of the mixer input signal in the second processing path based on content of the mixer input signal.

4. The apparatus of claim 3,
   wherein the second processing path comprises a third configurable degeneration component coupled between the first switch and the second configurable degeneration component, and the apparatus further comprising:
   a second switch in a third processing path coupled between the input port and the second configurable degeneration component,
   wherein the controller is coupled to the second switch and configured to toggle between coupling the input port to the second mixer through the second processing path and coupling the input port to the second mixer through the third processing path.

5. The apparatus of claim 3, further comprising a third configurable degeneration component in the first processing path between the input port and the first configurable degeneration component, and wherein the controller is coupled to the third configurable degeneration component and configured to control a first aspect of the third configurable degeneration component.

6. The apparatus of claim 5, further comprising:
a third mixer coupled to the input port; and
a fourth configurable degeneration component coupled between the third mixer and the input port,
wherein the controller is coupled to the fourth configurable degeneration component and configured to control a first aspect of the fourth configurable degeneration component.

7. The apparatus of claim 6, wherein the controller is configured to independently control the first aspect of the first configurable degeneration component, the first aspect of the second configurable degeneration component, the first aspect of the third configurable degeneration component, and the first aspect of the fourth configurable degeneration component.

8. The apparatus of claim 1, wherein the first configurable degeneration component comprises a variable resistor.

9. The apparatus of claim 1, further comprising a second degeneration component coupled in series to the first configurable degeneration component and the first mixer.

10. The apparatus of claim 9, wherein the second degeneration component is configurable, and wherein the controller is configured to control a first aspect of the second degeneration component.

11. The apparatus of claim 1, wherein the upconversion harmonics in the first mode correspond to a third harmonic and a fifth harmonic.

12. The apparatus of claim 1, wherein the controller is configured to control the first aspect of the first configurable degeneration component to the first value to suppress upconversion harmonics when the controller determines the mixer input signal comprises a carrier aggregation combination of n21 and n257 bands.

13. The apparatus of claim 1, wherein the controller is configured to control the first aspect of the first configurable degeneration component to the second value to suppress downconversion harmonics when the controller determines the mixer input signal comprises a carrier aggregation combination of n71 and n2 bands.

14. The apparatus of claim 1, further comprising:
a baseband filter (BBF) coupled to the first mixer through differential outputs of the first mixer;
a first resistor coupled between the first mixer and the baseband filter on a first output of the differential outputs;
a second resistor coupled between the first mixer and the baseband filter on a second output of the differential outputs; and
a capacitor coupled between the differential outputs of the first mixer.

15. The apparatus of claim 14, further comprising:
at least one low noise amplifier (LNA) comprising a first LNA coupled to the input port and configured to amplify an input signal for output as the mixer input signal.

16. The apparatus of claim 15, wherein the input port, the first mixer, and the first configurable degeneration component comprise a first downconverter, and wherein the apparatus comprises a plurality of downconverters coupled to the at least one low noise amplifier (LNA).

17. The apparatus of claim 16, wherein the apparatus comprises a user equipment (UE).

18. A method, comprising:
receiving a mixer input signal;
determining a plurality of frequencies active in the mixer input signal;
configuring a first degeneration component associated with a first mixer forming at least a portion of a harmonic rejection mixer (HRM) based on the plurality of frequencies; and
down-converting the mixer input signal in the first mixer, wherein configuring the first degeneration component of the first mixer comprises:
controlling a first aspect of the first degeneration component to a first value to suppress upconversion harmonics in a first mode or controlling the first aspect of the first degeneration component to a second value to suppress downconversion harmonics in a second mode in response the mixer input signal corresponding to a carrier aggregation combination of a first band and a second band, the first band having one or more harmonics that at least partially overlap the second band.

19. The method of claim 18, further comprising:
configuring a second degeneration component of a second mixer based, at least in part, on the plurality of frequencies; and
down-converting the mixer input signal in the second mixer.

20. The method of claim 19, wherein down-converting the mixer input signal in the second mixer comprises toggling a switch to pass the mixer input signal through an additional degeneration component associated with the second mixer.

21. An apparatus, comprising:
an input port configured to receive a mixer input signal;
a first mixer forming at least a portion of a harmonic rejection mixer (HRM);
a first configurable degeneration component of a first processing path coupled between the input port and the first mixer;
a second mixer;
a second configurable degeneration component of a second processing path coupled between the input port and the second mixer;
a first switch in the second processing path coupled between the input port and the second configurable degeneration component; and
a controller coupled to the first configurable degeneration component, wherein the controller is configured to control a first aspect of the first configurable degeneration component.

22. The apparatus of claim 21, wherein the controller is coupled to the first switch and configured to control the first switch to toggle processing of the mixer input signal in the second processing path based on content of the mixer input signal.

23. The apparatus of claim 22, further comprising a third configurable degeneration component in the first processing path between the input port and the first configurable degeneration component, and wherein the controller is coupled to the third configurable degeneration component and configured to control a first aspect of the third configurable degeneration component.

24. The apparatus of claim 23, further comprising:
a third mixer coupled to the input port; and
a fourth configurable degeneration component coupled between the third mixer and the input port,
wherein the controller is coupled to the fourth configurable degeneration component and configured to control a first aspect of the fourth configurable degeneration component.

25. The apparatus of claim 24, wherein the controller is configured to independently control the first aspect of the first configurable degeneration component, the first aspect of the second configurable degeneration component, the first aspect of the third configurable degeneration component, and the first aspect of the fourth configurable degeneration component.

26. The apparatus of claim 22,
wherein the second processing path comprises a third configurable degeneration component coupled between the first switch and the second configurable degeneration component, and the apparatus further comprising:
a second switch in a third processing path coupled between the input port and the second configurable degeneration component,
wherein the controller is coupled to the second switch and configured to toggle between coupling the input port to the second mixer through the second processing path and coupling the input port to the second mixer through the third processing path.

27. The apparatus of claim 21, wherein the controller is configured to suppress upconversion harmonics in a first mode and configured to suppress downconversion harmonics in a second mode.

28. An apparatus, comprising:
an input port configured to receive a mixer input signal;
a first mixer forming at least a portion of a harmonic rejection mixer (HRM);
a first configurable degeneration component of a first processing path coupled between the input port and the first mixer;
a second degeneration component coupled in series to the first configurable degeneration component and the first mixer; and
a controller coupled to the first configurable degeneration component, wherein the controller is configured to control a first aspect of the first configurable degeneration component.

29. The apparatus of claim 28, wherein the second degeneration component is configurable, and wherein the controller is configured to control a first aspect of the second degeneration component.

30. The apparatus of claim 28, wherein the controller is configured to suppress upconversion harmonics in a first mode and configured to suppress downconversion harmonics in a second mode.

31. An apparatus, comprising:
an input port configured to receive a mixer input signal;
a first mixer forming at least a portion of a harmonic rejection mixer (HRM);
a first configurable degeneration component of a first processing path coupled between the input port and the first mixer;
a controller coupled to the first configurable degeneration component, wherein the controller is configured to control a first aspect of the first configurable degeneration component;
a baseband filter (BBF) coupled to the first mixer through differential outputs of the first mixer;
a first resistor coupled between the first mixer and the baseband filter on a first output of the differential outputs;
a second resistor coupled between the first mixer and the baseband filter on a second output of the differential outputs; and
a capacitor coupled between the differential outputs of the first mixer.

32. The apparatus of claim 31, further comprising:
at least one low noise amplifier (LNA) comprising a first LNA coupled to the input port and configured to amplify an input signal for output as the mixer input signal.

33. The apparatus of claim 32, wherein the input port, the first mixer, and the first configurable degeneration component comprise a first downconverter, and wherein the apparatus comprises a plurality of downconverters coupled to the at least one low noise amplifier (LNA).

* * * * *